United States Patent [19]

Miki et al.

[11] Patent Number: 5,517,152
[45] Date of Patent: May 14, 1996

[54] CURRENT SOURCE CIRCUIT AND OPERATING METHOD THEREOF

[75] Inventors: Takahiro Miki; Yasuyuki Nakamura; Shiro Hosotani, all of Hyogo, Japan

[73] Assignee: Mitsubishi Denki Kabushiki Kaisha, Tokyo, Japan

[21] Appl. No.: 948,355

[22] Filed: Sep. 23, 1992

[30] Foreign Application Priority Data

Sep. 27, 1991 [JP] Japan ..................... 3-249283

[51] Int. Cl.⁶ .................. H01J 19/82; G05F 1/10; G05F 3/04; H03K 3/00
[52] U.S. Cl. ............... 327/530; 327/535; 327/537; 327/543; 327/108; 323/312
[58] Field of Search ................ 307/571, 585, 307/573, 443, 451, 270, 475, 570, 572, 445, 446, 448, 296.1, 296.5, 296.6, 296.8; 327/530, 535, 537, 538, 543, 108, 387, 391; 323/312

[56] References Cited

U.S. PATENT DOCUMENTS

| | | | |
|---|---|---|---|
| 4,958,091 | 9/1990 | Roberts | 307/571 |
| 4,988,893 | 1/1991 | Bonneau et al. | 307/585 |
| 4,998,028 | 3/1991 | Chappell et al. | 307/585 |
| 5,034,629 | 7/1991 | Kinugasa et al. | 307/585 |
| 5,047,766 | 9/1991 | Hofmann | 307/585 |
| 5,063,313 | 11/1991 | Kikuda et al. | 307/585 |

OTHER PUBLICATIONS

"Bidirectional CMOS DAC Current Switch" IBM Technical Disclosure Bulletin, vol. 31, No. 1, Jun. 1988, pp. 412–414.
T. Miki et al. "A 10Bit 50MS/s CMOS D/A Converter with 2.7V Power Supply" 1992 Symposium on VLSI Circuits, Jun. 1992, pp. 92–93.
Vivian Shen "Data Acquisition and Conversation" Degest of Technical Paters of 1983 IEEE, pp. 188–189.
T. Miki et al "An 80–MHZ 80Bit COMOS D/A Converter" IEEE Journal of Solid–State Circuit, vol.SC–21, No. 6, pp. 983–988.

*Primary Examiner*—David C. Nelms
*Assistant Examiner*—Trong Phan
*Attorney, Agent, or Firm*—Lowe, Price, LeBlanc & Becker

[57] ABSTRACT

A current source circuit according to the present invention is provided with an output terminal 100, a bias voltage source 21, N channel MOS transistors 2 and 1 and P channel MOS transistor 3. The source of transistor 2, the drain of transistor 1 and the drain of transistor 3 are connected to a common node, the drain of transistor 2 is connected to output terminal 100 and the gate of transistor 2 is connected to bias voltage source 21. Conductions of transistors 1 and 3 are dynamically controlled in response to an external signal. As a result, it is possible to implement a current source circuit having a small number of devices and enabling an operation at a high speed.

29 Claims, 22 Drawing Sheets

FIG. 21

| S101 | S102 | S305 | Vxn | Vxp | OUTPUT CURRENT |
|------|------|------|-----|-----|----------------|
| L | L | H | VDD | 0 | 0 |
| L | H | L | VDD | Vx' | FLOW-OUT |
| H | L | H | VDD | 0 | 0 |
| H | H | L | Vx | 0 | FLOW-IN |

FIG. 29

| C1 | C2 | R | DESIRED CONDITIONS OF CURRENT SOURCE CIRCUIT | S | ACHIEVED CONDITIONS OF CURRENT SOURCE CIRCUIT |
|---|---|---|---|---|---|
| 0 | 0 | 0 | OFF | 1 | OFF |
| 0 | 0 | 1 | OFF | 1 | OFF |
| 0 | 1 | 0 | * | 1 | OFF |
| 0 | 1 | 1 | * | 1 | OFF |
| 1 | 0 | 0 | OFF | 1 | OFF |
| 1 | 0 | 1 | ON | 0 | ON |
| 1 | 1 | 0 | ON | 0 | ON |
| 1 | 1 | 1 | ON | 0 | ON |

CURRENT SOURCE CIRCUIT AND OPERATING METHOD THEREOF

BACKGROUND OF THE INVENTION

1. Field of the Invention

The present invention relates to a current source circuit and an operating method thereof and, in particular, to a current source circuit having a current supply controlled in response to an external signal and an operating method thereof.

2. Description of the Background Art

A current source circuit having a current supply controlled in response to an external signal is conventionally used in various devices, such as a current summing type D/A converter and a sample and hold circuit.

FIG. 22 is a schematic block diagram showing a current summing type D/A converter having conventional current source circuits. Referring to FIG. 22, in a current source circuit 704, a current I flows in from a constant voltage source and the current supply is controlled by a switch 701 indicated functionally in response to an external digital control signal. In a current source circuit 705, a current 2I flows in from the constant voltage source and the current supply is controlled by a switch 702 indicated functionally in response to an external digital control signal. In addition, in a current source circuit 706, a current 4I flows in from the constant voltage source and the current supply is controlled by a switch 703 indicated functionally in response to an external digital control signal. A summation of currents flowing in current source circuits selected in response to externally provided digital signals flows through a load resistor 600 having a resistance value R and a voltage between its terminals is to be fetched as an analog output voltage.

On the other hand, FIG. 23 is a schematic block diagram showing a sample and hold circuit having conventional current source circuits. Referring to FIG. 23, current source circuits 804, 805, 806 and 807 serve as bidirectional bridge drivers for driving a diode bridge 801 by a switching control.

FIG. 24 is a schematic block diagram showing an example of a conventional current source circuit used in a device shown in FIGS. 23 and 24, which is described, for example, in "DATA ACQUISITION AND CONVERSION" by Vivian W-K Shen et al., *Digest of Technical Papers* of IEEE International Solid-State Circuits Conference, pp. 188–189, February, 1983. The current source circuit is a single output type current source circuit which may or may not supply an output current from an output terminal in response to an externally provided control signal.

Referring to FIG. 24, an output terminal 100 of a current source circuit is connected to the drain of an N channel MOS transistor 902. Transistor 902 has its source connected to the drain of an N channel MOS transistor 901 and transistor 901 has its source grounded. One bias voltage source 921 is connected to the gate of transistor 902. The other bias voltage source 920 is connected to the gate of transistor 901 through a conduction path of an N channel MOS transistor 903. Transistor 903 has its gate connected to a signal line 101a and N channel MOS transistors 904 and 905 have their gates commonly connected to a signal line 101b. Transistor 905 has its drain connected to bias voltage source 921 and its source connected to the source of transistor 902. Transistor 904 has its drain connected to the gate of transistor 901 and its source grounded.

An operation of a circuit shown in FIG. 24 will now be described. When turning on a current source circuit, a potential on signal line 101a becomes an H level and a potential on signal line 101b becomes an L level. Then, transistor 903 is turned on and transistors 904 and 905 are turned off, whereby potentials of bias voltage sources 921 and 920 are applied to gates of transistors 902 and 901, respectively. Both transistors 902 and 901 are turned on, whereby a current flows in transistors 902 and 901 from output terminal 100. In other words, a current flowing into a current source circuit is to be obtained from output terminal 100.

When turning off a current source circuit, a potential on signal line 101a becomes an L level and a potential on signal line 101b becomes an H level. Then, transistor 903 is turned off and transistors 904 and 905 are turned on, whereby gates of transistors 902 and 901 are connected to respective sources. As a result, transistors 902 and 901 are turned off and current flowing into a current source circuit is brought to 0.

FIG. 25 is a circuit diagram showing another example of a conventional current source circuit, which is described, for example, in "An 80-MHz 8-bit CMOS D/A Converter" by T. Miki, et al., *IEEE Journal of Solid-State Circuit*, Vol. SC-21, No. 6, pp. 983–988, December, 1986.

Referring to FIG. 25, a positive output terminal 100a and a complementary output terminal 100b of a current source are connected to drains of N channel MOS transistors 902a and 902b, respectively. Transistors 902a and 902b have their sources commonly connected to the drain of N channel MOS transistor 901 and transistor 901 has its source grounded. Bias voltage source 921 is connected to gates of N channel MOS transistors 902a and 902b through transmission gates 906a and 906b, respectively. Transistors 902a and 902b have their gates connected to drains of N channel MOS transistors 907a and 907b, respectively, and transistors 907a and 907b have their sources grounded. Another bias voltage source 920 is connected to the gate of transistor 901. Signal line 101a is connected to the gate of an N channel MOS transistor constituting transmission gate 906a, the gate of a P channel MOS transistor constituting transmission gate 906b, and the gate of transistor 907. On the other hand, signal line 101b is connected to the gate of an N channel MOS transistor constituting transmission gate 906b, the gate of a P channel MOS transistor constituting transmission gate 906a, and the gate of transistor 907a.

An operation of a circuit shown in FIG. 25 will now be described. The current source circuit is a current source circuit of a complementary output type obtaining an output current from any one of output terminals 100a or 100b. When trying to obtain a current from output terminal 100a, signal line 101a becomes an H level and 101b an L level. Transmission gate 906a and N channel MOS transistor 907b turned on, transmission gate 906b and N channel MOS transistor 907a are turned off, transistor 902a has its gate applied a potential of bias voltage source 921 and transistor 902b has its gate grounded. As a result, a current flows in transistors 902a and 901 from output terminal 100a and a path from terminal 100b to transistor 902b is rendered non-conductive.

On the other hand, when trying to obtain a current from output terminal 100b, signal line 101a becomes an L level and signal line 101b an H level. Transmission gate 906b and N channel MOS transistor 907a are turned on, transmission gate 906a and N channel MOS transistor 907b turned off, transistor 902b has its gate applied a potential of bias voltage source 921 and transistor 902a has its gate grounded. As a result, a current flows in transistors 902b and 901 from terminal 100b and a path from terminal 100a to transistor 902b is rendered non-conductive.

FIG. 27 is a circuit diagram showing a further example of a conventional current source circuit, which is described, for example, in "a 30-MHz 10-CMOS D/A Converter" by K. Oka et al., *IEICE Technical Report,* Paper No. ICD 88-6, pp. 39–46. 1988.

Referring to FIG. 27, the source of an N channel MOS transistor 912, the drain of an N channel MOS transistor 911 and the source of an N channel MOS transistor 913 are connected to a common node. Transistor 912 has its gate connected to a bias voltage source 914, transistor 911 has its gate connected to a bias voltage source 915 and transistor 913 has its gate connected to a signal line 101a. Transistor 912 has its drain connected to an output terminal 100, transistor 911 has its source connected to a ground potential and transistor 913 has its drain connected to a voltage source potential $V_{DD}$.

An operation of the circuit shown in FIG. 27 will now be described. In the circuit shown in FIG. 27, transistors 912 and 913 having the same conductivity type constitute a differential pair. In general, drain current of transistor 912 is larger than that of transistor 913 when a potential on signal line 101a is lower than that of bias voltage source 914, while drain current of transistor 913 is larger than that of transistor 912 when a potential on signal line 101a is higher than that of bias voltage source 914.

Especially, the case should be considered wherein an amplitude of potential change on signal line 101a is a normal logic amplitude. In such a case, when a potential on signal line 101a becomes an L level, drain current of transistor 911 flows from only transistor 912, whereby a current flows from output terminal 100 to conductive paths of transistors 912 and 911. In other words, a current flowing into the current source circuit is obtained from output terminal 100.

On the other hand, when a potential on signal line 101a becomes an H level, drain current of transistor 911 flows from only transistor 913, whereby a current amount flowing into the current source circuit becomes zero.

There were problems as follows in the conventional current source circuits constituted as described above. In a conventional single output type circuit shown in FIG. 24, transistors 903 and 905 are on/off controlled by signals on signal lines 101a and 101b, whereby a current of transistors 901 and 902 constituting a current path is indirectly controlled. On the other hand, in a conventional complementary output type circuit shown in FIG. 25, transistors 907a and 907b and transmission gates 906a and 906b are on/off controlled by signals on signal lines 101a and 101b, whereby a current of transistors 901, 902a and 902b constituting a current path is indirectly controlled.

More specifically, in conventional current source circuits as mentioned above, since transistors constituting a current path are on/off controlled indirectly, five and nine transistors are needed in a single output type and a complementary output type, respectively. This created a problem that the number of devices constituting a current source circuit increased as a whole.

In a conventional single output type circuit shown in FIG. 27, the number of transistors is reduced to three while two bias voltage sources are still required. This results in insufficient simplification of the circuit structure of the current source circuit.

Furthermore, in the conventional single output type circuit shown in FIG. 27, the transistor 911 is always conductive even when a potential on signal line 101a is at an H level and output current at output terminal 100 is zero. This results in the increased power consumption.

SUMMARY OF THE INVENTION

An object of the present invention is to provide a current source circuit which is designed to reduce the number of devices.

Another object of the present invention is to provide a current source circuit which is designed to operate at high speed and an operating method thereof.

Still another object of the present invention is to provide a current source circuit which is designed to make an output voltage stable and an operating method thereof.

Still further object of the present invention is to provide a current source circuit wherein the voltage source potential can be lowered while maintaining the high speed operation and an operating method thereof.

Briefly stated, the present invention is a current source circuit comprising first and second transistors establishing a first series current flow path between a source of first constant potential and an output current terminal, and a third transistor of conductivity type opposite that of the second transistor for establishing a second series current flow path between a source of second constant potential and one conduction terminal of the first transistor. A control electrode of the first transistor receiving a signal of third constant potential, and control electrodes of the second and third transistors connected to receive a control voltage for controlling an operating state of the current source.

A current source circuit according to another aspect of the present invention is provided with a first output terminal supplying an output current, a first bias voltage source, a first semiconductor device having a first conduction terminal, and a second conduction terminals and a control terminal, a second semiconductor device having a first conduction terminal, a second conduction terminal and a control terminal, a third semiconductor device having a first conduction terminal, a second conduction terminal and a control terminal and being of a conductivity type opposite that of the second semiconductor device, wherein the first conduction terminal of the first semiconductor device, the second conduction terminal of the second semiconductor device and the second conduction terminal of the third semiconductor device are connected to a common node, the second conduction terminal of the first semiconductor device is connected to the first output terminal, the control terminal of the first semiconductor device is connected to the first bias voltage source, and the current source circuit is further provided with a circuit controlling dynamically conduction of the second and the third semiconductor devices in response to an external signal.

In a current source circuit according to the present invention, when trying to obtain a current output, the second semiconductor device is rendered conductive and the third semiconductor device is rendered non-conductive in response to an external signal. This makes current flow in a current path of the first and the second semiconductor devices and the first semiconductor device makes an output current stable. When a current output is to be cut off, the second semiconductor device is rendered non-conductive and the third semiconductor element is rendered conductive in response to an external signal. This renders a current path of the first and the second semiconductor devices non-conductive and the first conduction terminal of the first semiconductor device is charged or discharged through the third semiconductor device. As a result, it becomes possible to operate a current source circuit constituted by a small number of devices at high speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 21 is a table explaining an operation of the tenth embodiment.

FIG. 29 is a truth table used for turning on/off the current source circuit.

DESCRIPTION OF THE PREFERRED EMBODIMENTS

Figure 1:
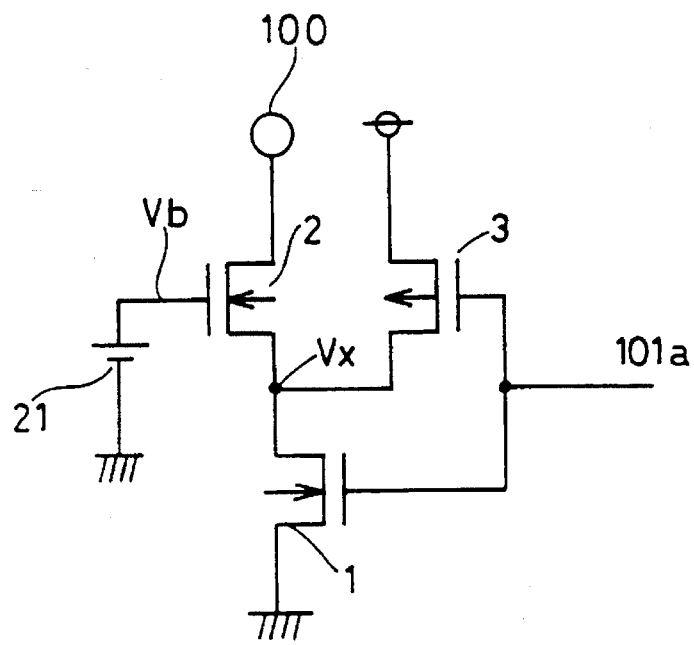
FIG. 1 is a circuit diagram showing a current source circuit according to a first embodiment of the present invention.

The preferred embodiments of the present invention will be described hereinafter with reference to the drawings. FIG. 1 is a circuit diagram showing a current source circuit according to a first embodiment of the present invention.

Referring to FIG. 1, the source of an N channel MOS transistor 2, the drain of an N channel MOS transistor 1 and the drain of a P channel MOS transistor 3 are connected to a common node. Transistor 2 has its gate connected to a bias voltage source 21 and transistors 1 and 3 have their gates connected to a signal line 101a. Transistor 1 has its source connected to a first constant potential (which is a ground potential in the embodiment), and transistor 3 has its source connected to a second constant potential (which is a voltage source potential $V_{DD}$ in the embodiment).

An operation of the first embodiment shown in FIG. 1 will now be described. When a current source circuit is to be turned on, a potential on signal line 101a becomes an H level. Transistor 1 is rendered conductive and transistor 3 is rendered non-conductive, whereby a current flows from an output terminal 100 to a conduction path of transistors 2 and 1. In other words, a current flowing into the current source circuit is obtained from output terminal 100.

On the other hand, when a current source circuit is to be turned off, a potential on signal line 101a becomes an L level. Transistor 1 is rendered non-conductive and transistor 3 is rendered conductive. Immediately after that, although a current flows to the source of transistor 2 from transistors 2 and 3, since transistor 1 is rendered non-conductive, a source voltage $V_X$ of transistor 2 increases rapidly and gate-source voltage of transistor 2 becomes smaller than a threshold value $V_{TH}$. As a result, transistor 2 is rendered non-conductive and an amount of an output current in the current source circuit becomes 0.

Figure 24:
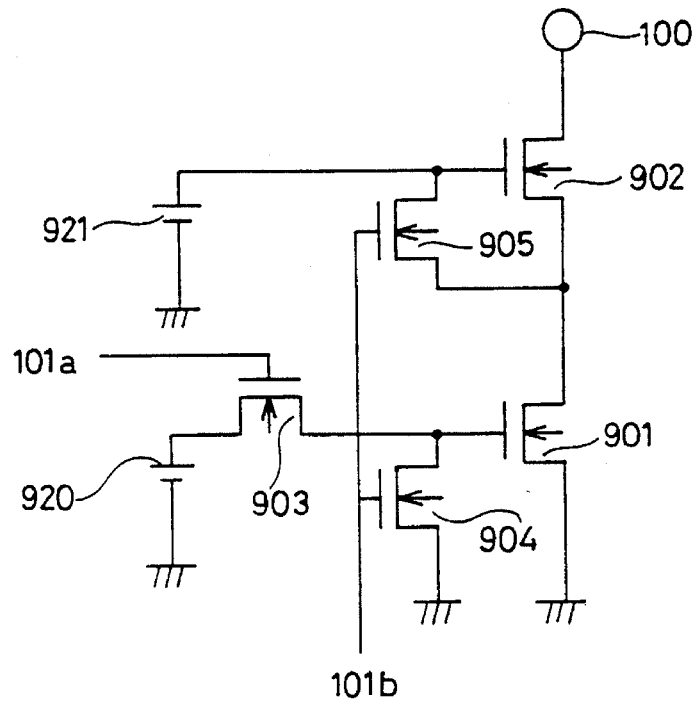
FIG. 24 is a circuit diagram showing a structure of a conventional current source circuit.

As described in the "Description of the Background Art", in the conventional single output type circuit shown in FIG. 24, although the output current path is rendered non-conductive and no electric power is consumed when the current source circuit is off, this circuit still needs five transistors and two bias voltage sources.

Figure 27:
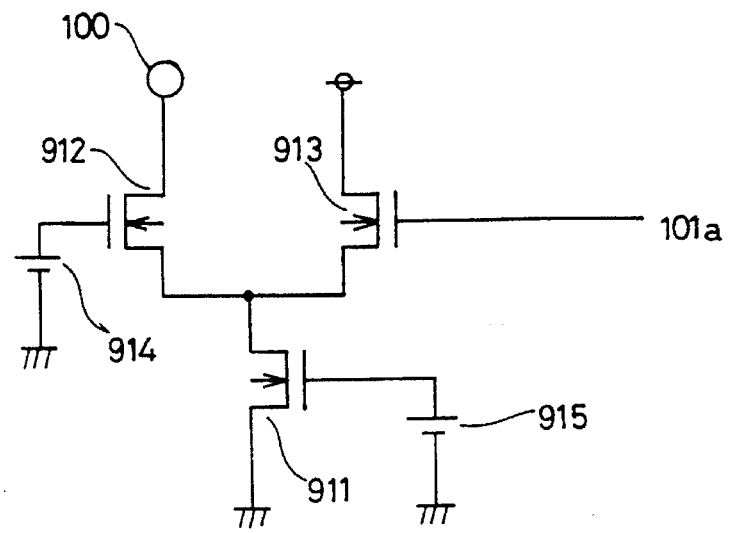
FIG. 27 is a circuit diagram showing a further structure of a conventional current source circuit.

On the other hand, in the conventional single output type circuit shown in FIG. 27, although the number of transistors is reduced to three, electric power is consumed even when the current source circuit is off.

On the contrary, in the first embodiment shown in FIG. 1, the number of transistors and the number of bias voltage sources are reduced to three and one, respectively, and, in addition, transistor 1 is rendered non-conductive and no electric power is consumed when the current source circuit is off.

Figure 2:
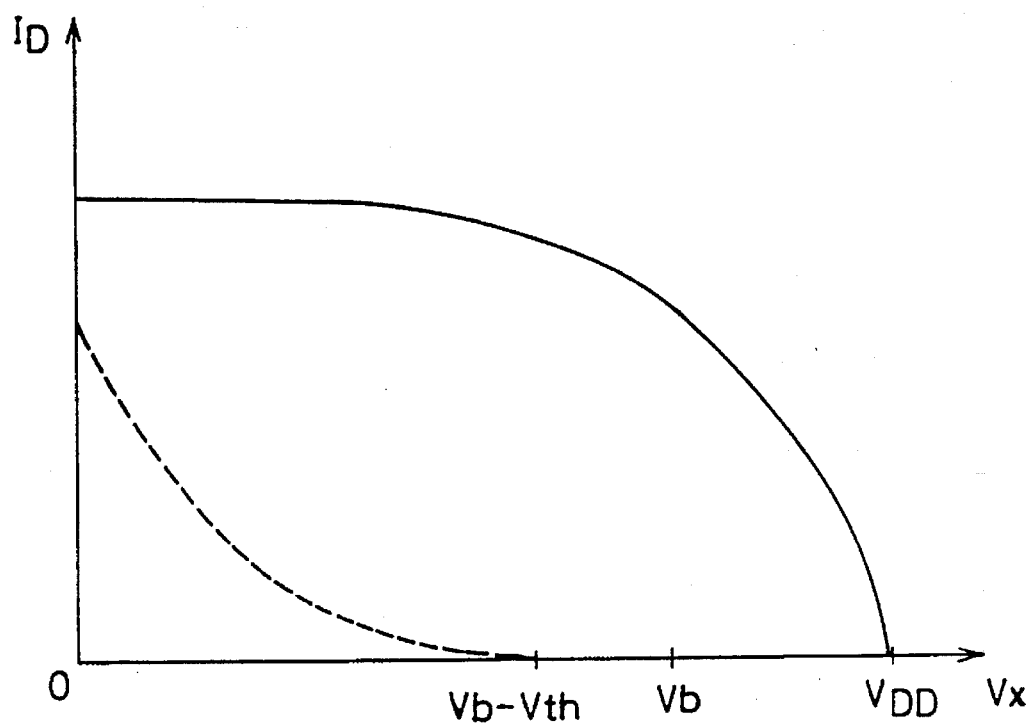
FIG. 2 is a diagram explaining an operation of the first embodiment of the present invention.

FIG. 2 is a characteristic diagram explaining an operation of the embodiment shown in FIG. 1. It will be described hereinafter with reference to FIG. 2 why P channel MOS transistor 3 is provided. First of all, consider the case where a current source circuit of FIG. 1 has no transistor 3. A dashed line in FIG. 2 shows the relation between source potential $V_X$ and drain current $I_D$ of transistor 2 in this case. When potential on signal line 101a becomes an L level in order to turn off a current source circuit, source potential $V_X$ of transistor 2 is increased by current flowing in transistor 2 even if there is no transistor 3. In this state, a current supplied to the source of transistor 2 is exactly output current $I_{out}$ flowing in from output terminal 100. Therefore, a change in $V_X$ decreases and a setting speed of $I_{out}$ is also reduced in proportion to approximation of output current $I_{out}$ to zero due to an increase in source potential $V_X$ of transistor 2.

Next, consider the case where transistor 3 is provided in accordance with the present invention. A solid line of FIG. 2 shows the relation between source potential $V_X$ of transistor 2 and drain current $I_D$ of transistor 3 in this case. In the case of FIG. 1, since a path for charge/discharge of the source of transistor 2 is provided other than an output current path by provision of transistor 3, a current through the transistor 3 also contributes to a change in source potential $V_X$ of transistor 2. In other words, current flowing in transistor 2 continues to flow until source potential $V_X$ of transistor 2 becomes source potential of transistor 3, i.e., voltage source potential $V_{DD}$. Therefore, as shown by the solid line in FIG. 2, even if output current $I_{out}$ approaches zero, a change in source potential $V_X$ does not decrease to thus quicken transient response of the current source circuit.

It is necessary for a current source circuit to obtain an almost constant output current regardless of a voltage variation of an output terminal. With reference to the first embodiment, general characteristics of a transistor will be described before explanation of how potential is made constant.

Figure 26:
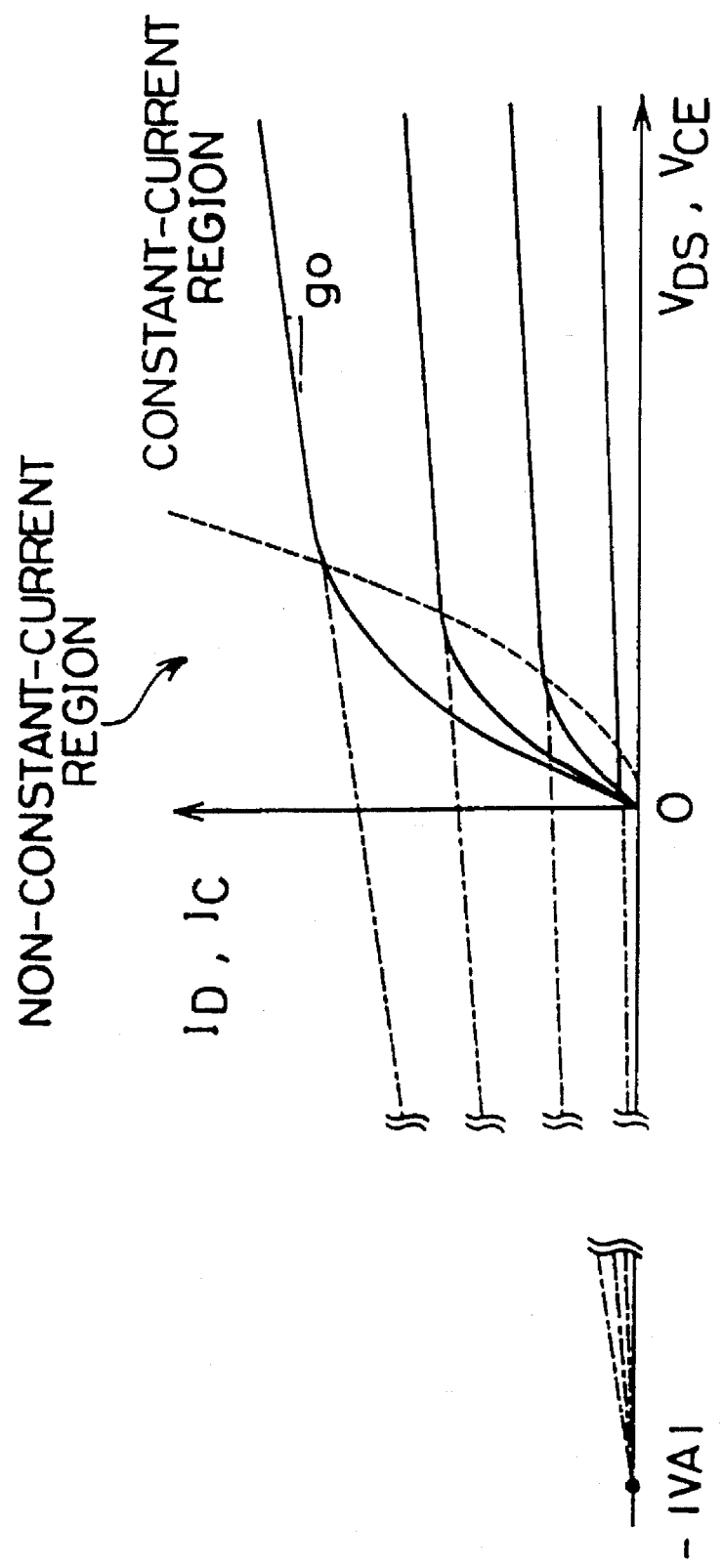
FIG. 26 is a diagram explaining general characteristics of a transistor.

In various transistors such as an MOS transistor, a bipolar transistor, a JFET and the like, there exist operating regions having high and low changing rates go of drain (collector) current due to a drain-source (collector-emitter) voltage variation. While a region having a low rate go is generally called saturation region for an MOS transistor, a region having a high rate go is called saturation region for a bipolar transistor. To avoid such a confusion, a region having a low rate go is referred to as constant current region while the remaining region is referred to as non-conductive region hereinafter. FIG. 26 shows characteristics of a general transistor. In FIG. 26, the slope of the curve shows the rate go. In the case of an MOS transistor, when drain-source voltage $V_{DS}$ and gate-source voltage $V_{GS}$ satisfy the following equation (1), drain current $I_D$ can be approximated by equation (2):

$$V_{DS} > V_{GS} - V_{TH} \tag{1}$$

$$I_D = (\beta/2)(V_{GS} - V_{TH})^2(1 + V_{DS}/V_A) \tag{2}$$

where $\beta$ is a factor which is proportional to and inversely proportional to a channel width and a channel length of an MOS transistor, respectively, and $V_A$ is a channel length modulation voltage, which is almost proportional to channel length. Therefore, go at this time is given by the following equation:

$$go = dI_D/dV_{DS} = I_D/(V_{DS} + V_A) \tag{3}$$

Equation (4) holds in a non-constant current region. When it holds, drain current $I_D$ can be approximated by equation (5):

$$V_{DS} < V_{GS} - V_{TH} \tag{4}$$

$$I_D = (\beta/2)[2(V_{GS} - V_{TH})V_{DS} - V_{DS}^2] \tag{5}$$

Thus, go at this time is given by the following equation:

$$go = dI_D/dV_{DS} = \beta(V_{GS} - V_{TH} - V_{DS}) \tag{6}$$

Figure 25:
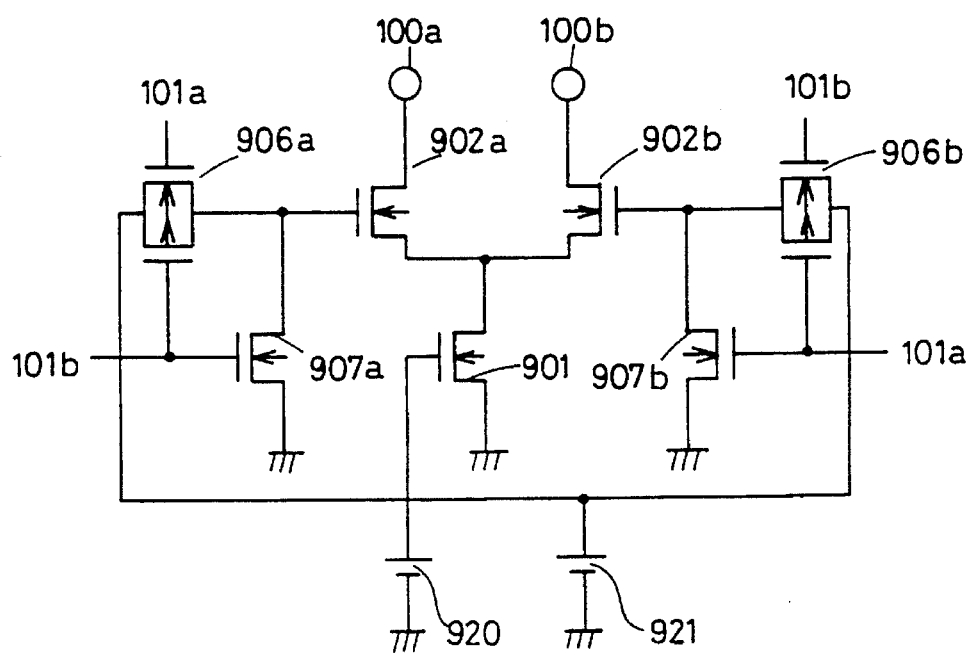
FIG. 25 is a circuit diagram showing another structure of a conventional current source circuit.

In addition, when two transistors are cascade-connected to a current path as in conventional examples shown in FIGS. 24 and 25 and in the first embodiment shown in FIG. 1, changing rate Go of an output current with respect to a voltage change of an output terminal is given by the following equation:

$$Go = go1 \cdot go2/(gm2 + go2 + go2) \tag{7}$$

where go1 and go2 are go of transistor 1 and go of transistor 2, respectively, and gm2 is a changing rate of a drain voltage of transistor 2 due to a voltage variation between the gate and the source, i.e., a mutual conductance. Therefore, if either or both of go1 and go2 are small, Go also becomes small, thereby improving constant-current characteristics of a current source.

In the present invention, at least transistor 2 is rendered operative in a constant current region. Therefore, according to equation (1), $V_{outmin}$ may be defined so as to satisfy the following equation:

$$V_{outmin} > V_G2 - V_{TH}2 \tag{8}$$

where $V_{outmin}$ is allowable minimum voltage of output terminal, $V_G2$ is a gate voltage of transistor 2, i.e. output voltage of a bias voltage source and $V_{TH}2$ is a threshold value of transistor 2.

For example, when a load resistor is a resistor having a resistance value RL and having one end connected to a voltage source potential $V_{DD}$ and the other end connected to output terminal 100, potential of the output terminal is $V_{DD}$ when a current source circuit is turned off, and potential of the output terminal is $V_{DD} - RL \cdot I_{out}$ when a current source circuit is turned on. Therefore, various constants such as RL, $I_{out}$, $V_G2$ may be defined so as to hold the following equation:

$$V_{outmin} = V_{DD} - RL \cdot I_{out} > V_G2 - V_{TH}2$$

When equation (8) is satisfied, the following equation is obtained:

$$go2 = I_{out}/(V_{DS}2 + V_A2) \tag{9}$$

where $V_{DS}2$ is a voltage between the drain and source of transistor 2 and $V_A 2$ is a channel length modulation voltage of transistor 2.

On the other hand, the ratio of change $\Delta I_{out}$ of an output current to $I_{out}$ when a voltage of an output terminal changes in the range of $\Delta V_{out}$ is given by the following equation:

$$\Delta I_{out}/I_{out} = \Delta V_{out} \cdot Go/I_{out} \quad (10)$$

Assuming that go1 is infinite in equation (7) as an extreme example, the following equation holds:

$$Go = go2 \quad (11)$$

Thus, the following equation holds:

$$\Delta I_{out}/I_{out} = \Delta V_{out} \cdot go2/I_{out} = \Delta V_{out}/(V_{DS}2+V_A 2) \quad (12)$$

The value of $V_A 2$ becomes larger as gate length of transistor 2 becomes longer and longer. However, as a practical value, assuming that $V_A 2 = 300$ V (which is easily obtained with gate length of approximately 10 μm according to today's semiconductor manufacturing technology) and further assuming that $V_{DS}2$ is 2 V and $\Delta V_{out}$ is 1 V, the following high constant-current characteristics are obtained:

$$\Delta I_{out}/I_{out} \approx 0.33\%$$

Although the above calculation is performed assuming that go1 is infinite, it is actually finite. Therefore, whether or not an operation state of transistor 1 is in a constant current region, constant-current characteristics of a current source are more enhanced than in the example described above by existence of transistor 1 in itself.

Figure 3:
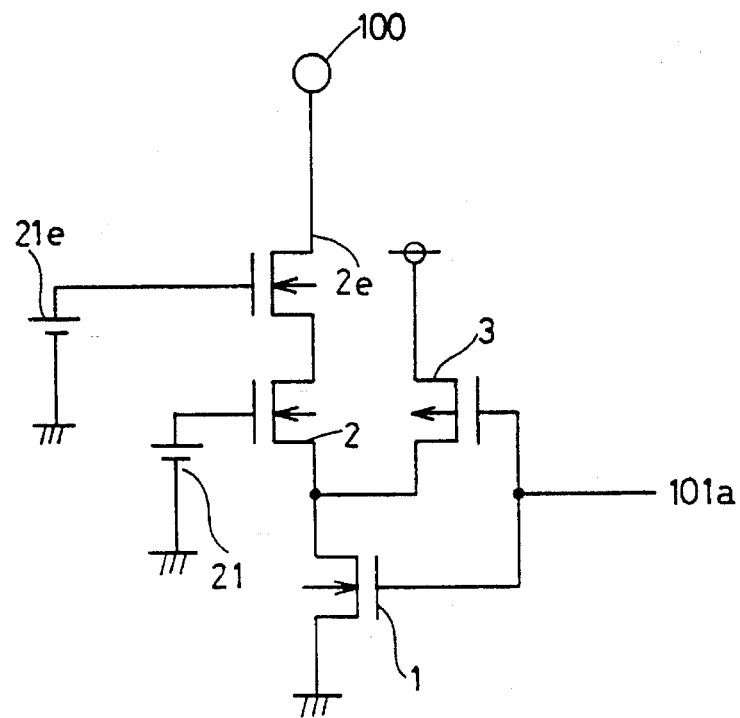
FIG. 3 is a circuit diagram showing a variation of the first embodiment.

As shown in FIG. 3, when a transistor 2e (an N channel MOS transistor in this embodiment) being of the same kind and having the same conductivity type as that of transistor 2, or a transistor (for example, an NPN transistor and the like) being of a different kind and having a conductivity type corresponding to that of transistor 1 is cascade-connected to the drain side of transistor 2 and the gate (or the base) is biased by a bias voltage source 21e, the constant-current characteristics are further improved, because changing rate Goc of an output current to a voltage change of output terminal 100 after the cascade-connection is given by the following equation in the same manner as equation (7) with changing rate Go before the cascade-connection. In the following equation, gm3 and go3 are gm and go of a newly connected transistor.

$$Goc = Go \cdot go3/(gm3+Go+go3) < Go$$

As described above, according to the present invention, constant-current characteristics of a current source circuit are obtained by rendering at least transistor 2 operative in a constant current region. On the other hand, it is preferable to render transistor 1 operative in a non-constant current region in order to achieve high speed operation as well as lower voltage source potential $V_{DD}$. That is, when the current source circuit is turned on, it is necessary that source voltage $V_X$ of at least transistor 2 is settled to make the output settled. A time constant τx of this node is given by the following equation:

$$\tau x = Cx/(gm2+go1) \quad (13)$$

where Cx is a parasitic capacitance.

Therefore, while a time constant is large and settling of an output is slow in a constant current region where go1 is low, a response rate of a current source circuit increases in a non-constant region where go1 is high, because a reducing effect of a time constant is produced by go1.

Transistor 1 can be rendered operative in a non-constant current region in the following way. More specifically, the following equation is given from equation (2) since transistor 2 is operating in a constant current region:

$$V_X = V_G 2 - V_{TH} 2 - (2I_{out}/\beta 2)^{1/2} \quad (14)$$

where $\beta 2$ is $\beta$ of transistor 2.

In the above equation, it is assumed that $V_A$ is infinite to simplify the calculation. $I_{out}$ is a desired amount of output current.

To render transistor 1 operative in a non-constant-current region, it is necessary that the following equation holds:

$$V_G 1 - V_{TH} 1 = V_G 2 - V_{TH} 2 - (2I_{out}/\beta 2)^{1/2} \quad (15)$$

where $V_G 1$ is a gate voltage of transistor 1 and $V_{TH} 1$ is a threshold of transistor 1 when a current source is turned on.

Therefore, if $V_G 2$ is set to be appropriately low, equation (15) is satisfied. It is also possible to make β2 smaller by rendering gate width appropriately small, which is easily implemented. It is more preferable to make $V_G 2$ lower, because an allowable minimum value of the output voltage range expressed by equation (8) becomes smaller.

In this embodiment in particular, since $V_G 1$ in an on state is equal to potential of an H level on signal line 101a, i.e., voltage source potential, equation (15) has a larger term on the left and the implementation is easier.

Output current $I_{out}$ is given by the following equation according to equation (5):

$$I_{out} = (\beta \frac{1}{2})[2(V_G 1 - V_{TH} 1)V_X - V_X^2] \quad (16)$$

where β1 is β of transistor 2.

Therefore, output current $I_{out}$ is obtained by eliminating $V_X$ from equations (14) and (16). In other words, although $I_{out}$ depends on β1, β2, $V_G 1$ and $V_G 2$, setting of $I_{out}$ to a desired value is easily implemented by properly adjusting these parameters in the range that equation (15) is satisfied.

The lower allowable minimum value $V_{outmin}$ at output terminal 100 of the current source circuit as described above makes it possible to lower a voltage source potential $V_{DD}$ of a voltage source (not shown) connected to output terminal 100.

In this connection, if transistor 911 is rendered operative in the non-constant current region in order to lower the voltage source potential $V_{DD}$ in the conventional single output type circuit shown in FIG. 27, there will be a problem that the power consumption in the turned-off state of the circuit becomes larger than that in the turned-on state of the circuit.

More specifically, in the conventional circuit shown in FIG. 27, the output current at output terminal 100 is turned off by rendering a potential on the gate of N channel MOS transistor 913 an H level as described in the description of the background art.

As a result, a drain-source voltage of transistor 913 becomes larger when the output current is in the off state. Therefore, a drain current of transistor 911 is increased largely when transistor 911 is operated in the non-constant current region.

As a result, there is a difficulty in lowering the voltage source potential $V_{DD}$ by rendering transistor 911 operative in the non-constant current region since the power consumption in the turned off state of the circuit largely increases. On the contrary, according to the first embodiment of the present invention, the voltage source potential $V_{DD}$ applied to output terminal 100 can be lowered by rendering transistor 1 operative in the non-constant current region.

In addition to implementation of a high speed rate by provision of transistor 8 as described before and implementation of a high speed rate by rendering transistor 1 operative in a non-constant current region as described above, a current source circuit according to the present invention operates at high speed because of the following reasons.

More specifically, both in conventional examples and in the present invention, it is necessary to use a transistor having relatively long gate length as at least one of a plurality of transistors constituting a current source circuit and to render this transistor operative in a constant current region. On the other hand, since a transistor having long gate length often induces an increase in gate capacitance, speed is reduced when it is driven dynamically.

However, in the present invention, the gate of transistor 2 having long gate length is not driven dynamically since it is maintained constant potential by bias voltage source 21. In the present invention, transistors 1 and 3, gate length of which may be short, are structured to be driven dynamically. Therefore, a higher speed rate of an operation is implemented in a current source circuit according to the present invention.

Figure 4:
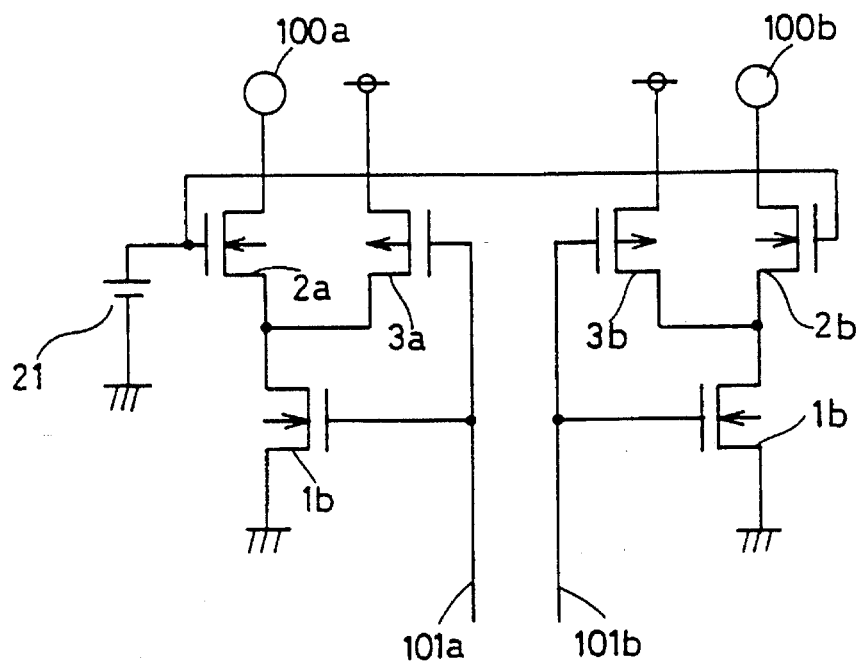
FIG. 4 is a circuit diagram showing a current source circuit according to a second embodiment of the present invention.

FIG. 4 is a circuit diagram showing a current source circuit according to a second embodiment of the present invention, and shows an example where the present invention is applied to a current source circuit of a complementary output type. Referring to FIG. 4, each of the circuits formed by transistors 1a, 2a and 3a and formed by transistors 1b, 2b and 3b is a circuit of the same structure as that of the first embodiment shown in FIG. 1. However, transistors 2a and 2b have their gates commonly connected to the same bias voltage source 21.

Complementary digital signals are applied to signal lines 101a and 101b. In other words, when signal line 101a is at an H level and signal line 101b at an L level, a current source circuit of transistors 1a, 2a and 3a is turned on and a current source circuit of transistors 1b, 2b and 3b turned off. Conversely, signal line 101a is at an L level and signal line 101b in at H level, a current source circuit of transistors 1a, 2a and 3a is turned off and a current source circuit of transistors 1b, 2b and 3b turned on.

Since transistors 2a and 2b have their gates commonly connected to the same bias voltage source 21, output terminals 100a and 100b have the equal output current amount. As described above, the second embodiment shown in FIG. 4 constitutes a current source circuit of a complementary output type.

Figure 28:
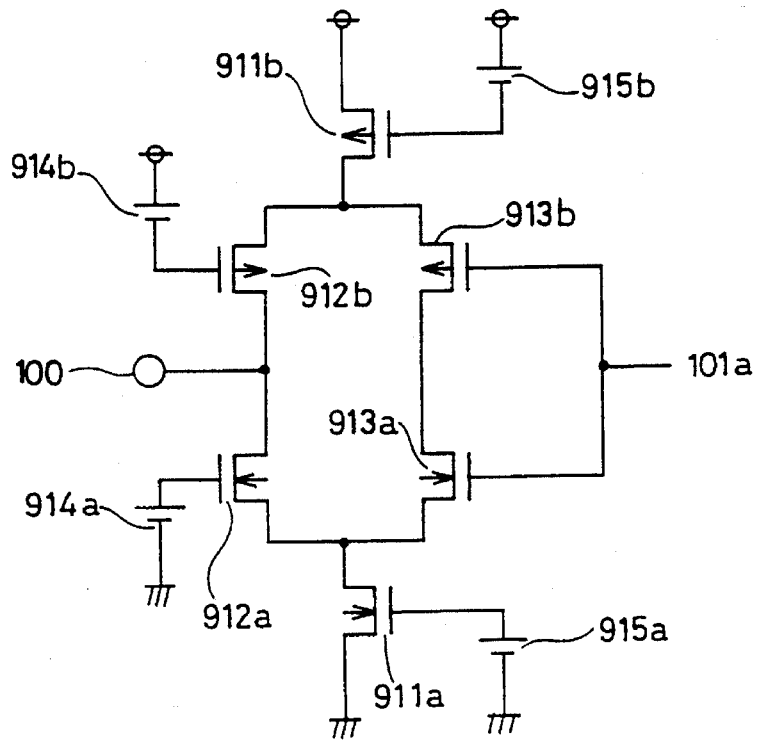
FIG. 28 is a circuit diagram showing a structure of a current source circuit implemented by enlarging the conventional circuit of FIG. 27.

The case should be supposed wherein two conventional single output type circuits of FIG. 27 are combined to form an enlarged current source circuit to be complementarily driven. FIG. 28 shows such a circuit, formed by combining two conventional circuits of FIG. 27, which is not actually known to date.

As a result of comparison of the circuit thus formed with the second embodiment shown in FIG. 4, it should be noted that the number of bias voltage sources in the second embodiment is reduced to only one as in the first embodiment as described above.

In the circuit shown in FIG. 28, electric power is always consumed irrespective of on/off of the current source circuit for the same reason as described in the foregoing in connection with the conventional single output type circuit shown in FIG. 27. Especially, the power consumption in the off state of the current source circuit is largely increased when transistor 911 is operated in the non-constant current region for the purpose of achieving the lower voltage source potential.

On the contrary, in the second embodiment shown in FIG. 4, it should be noted that when a current source circuit at one side (for example, a circuit including transistors 1a, 2a and 3a) is being turned on to generate output current on output terminal 100, no electric power is consumed in a current source circuit at the other side which is being turned off (for example, a circuit including transistors 1b, 2b and 3b). It should be also noted that the voltage source potential $V_{DD}$ can be lowered without increasing power consumption in this second embodiment by operating transistors 1a and 1b in the non-constant current region.

Figure 5:
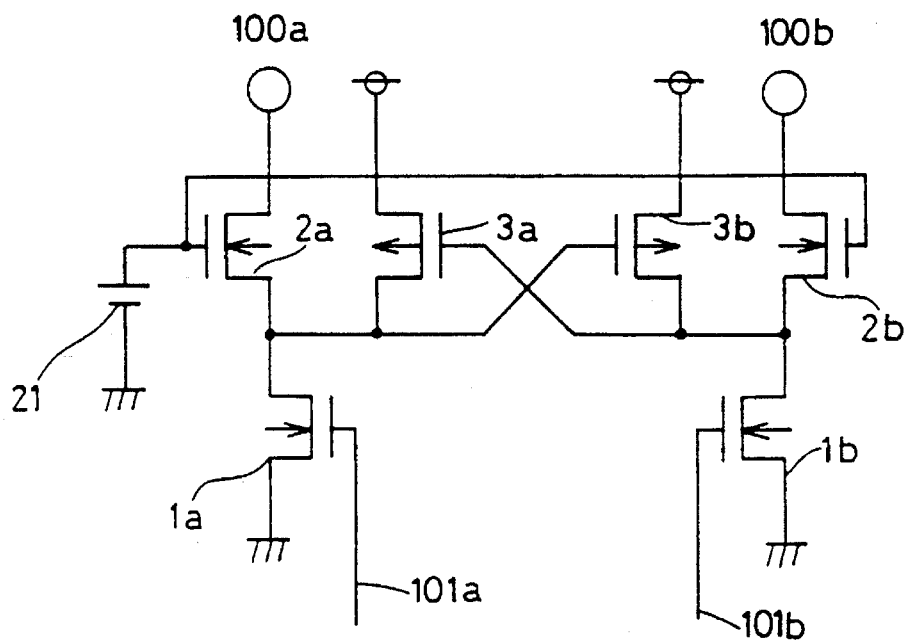
FIG. 5 is a circuit diagram showing a current source circuit according to a third embodiment of the present invention.
Figure 6:
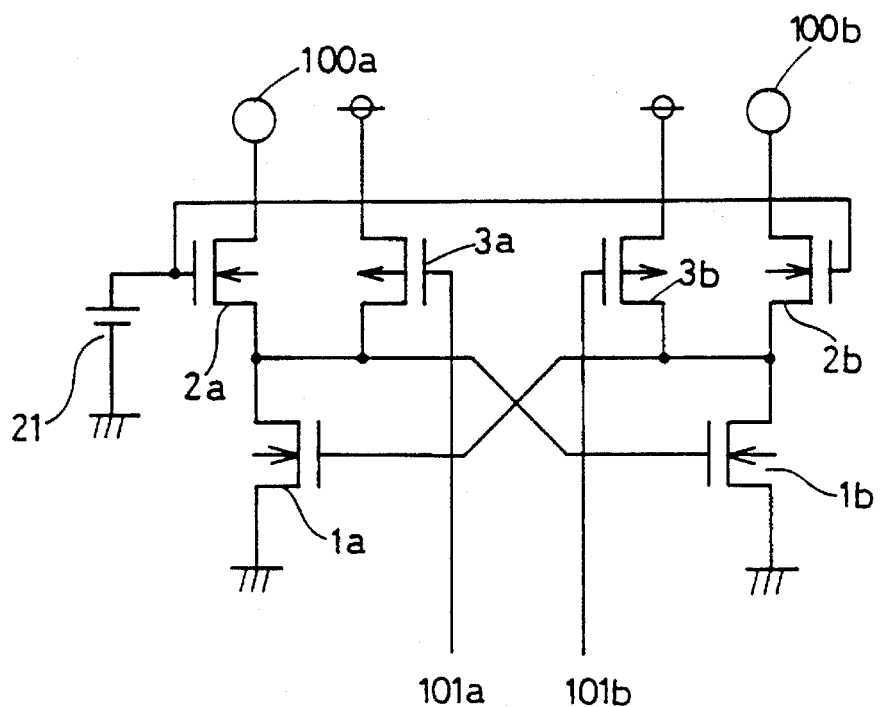
FIG. 6 is a circuit diagram showing a current source circuit according to a fourth embodiment of the present invention.

FIGS. 5 and 6 are circuit diagrams showing current source circuits according to a third embodiment and a fourth embodiment, respectively, of the present invention. In these embodiments in FIGS. 5 and 6, it is an object to suppress the influence when a skew is produced in complementary signals which control a current source, that is, when logic changes of two signal lines occurs at the timings slightly different from each other.

In the third embodiment shown in FIG. 5, transistor 3a has its gate connected to the drain of transistor 3b and transistor 3b has its gate connected to the drain of transistor 3a. Other than that, the third embodiment is the same as the second embodiment shown in FIG. 4.

Figure 8:
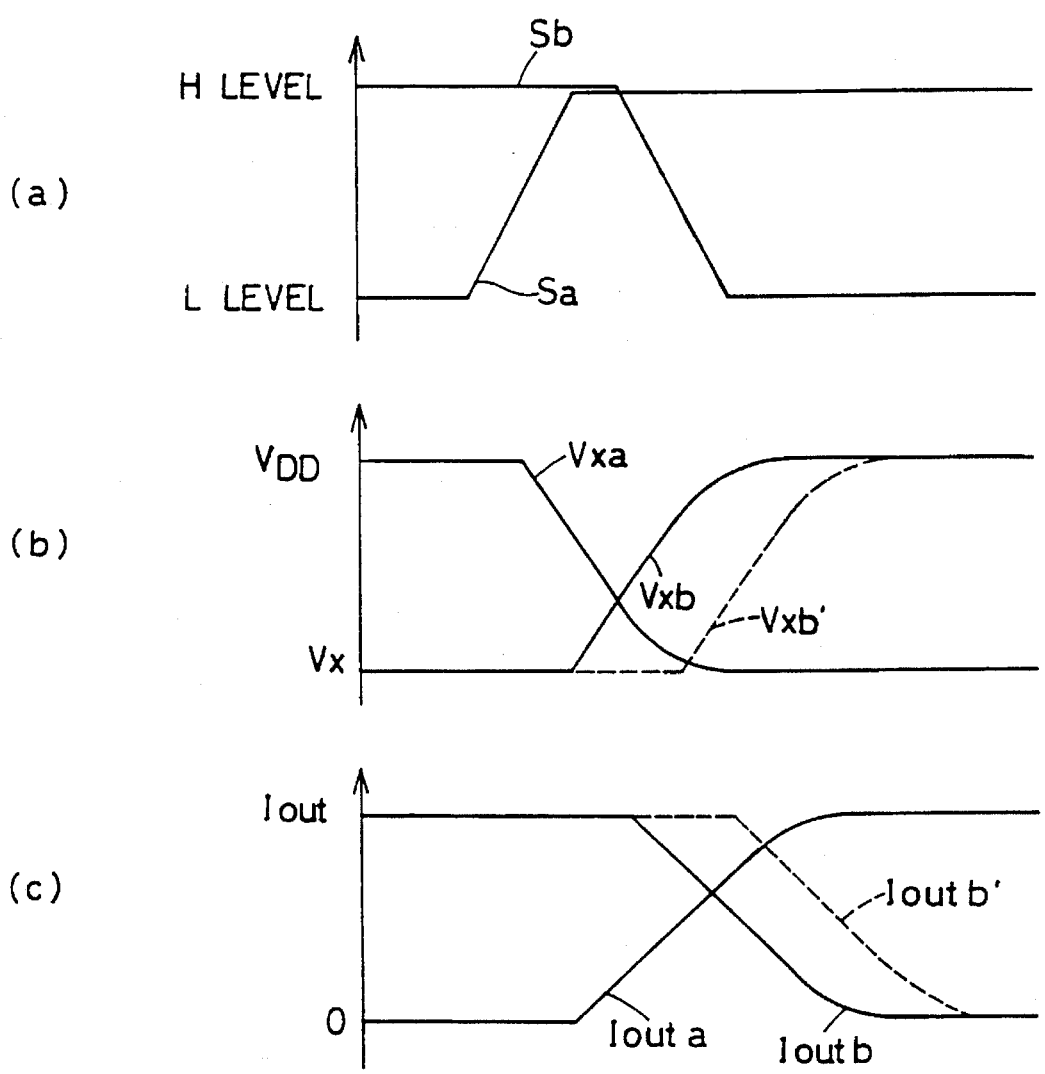
FIG. 8 is a timing diagram explaining an operation of the third embodiment of the present invention.

FIG. 8 is a timing chart explaining an operation of the third embodiment. An operation of a circuit shown in FIG. 5 will be described hereinafter with reference to FIG. 8. Referring to FIG. 8, Sa and Sb show logic levels in signal lines 101a and 101b, respectively, Vxa and Vxb source potentials of transistors 2a and 2b, respectively, and $I_{out}$ a and $I_{out}$ b output currents obtained from output terminals 100a and 100b, respectively. Vx on the ordinate is source potential, which is given by equation (14), of transistor 2a or transistor 2b when a current source is turned on, and $I_{out}$ is an output current when a current source is turned on.

Referring to FIG. 8(a), suppose that initially Sa is at an L level and Sb at an H level. At this time, transistor 1a is turned off and transistor 1b turned on. As shown in FIG. 8(b), Vxa is source voltage $V_{DD}$ and Vxb is Vx given by equation (14). This state is maintained by transistor 3b which is turned off by Vxa (= $V_{DD}$) and transistor 3a which is turned on by Vxb (= Vx). Therefore, as shown in FIG. 8(c), current $I_{out\ a}$ of output terminal 100a becomes 0 and current $I_{out\ b}$ of output terminal 100b becomes a predetermined value $I_{out}$.

As shown in FIG. 8(a), when Sa changes to an H level, transistor 1a is turned on and Vxa drops as shown in FIG. 8(b). Since this causes transistor 3b to be turned on, Vxb increases while $I_{out\ b}$ begins to drop, even if Sb is still at an H level. When Sb becomes an L level, (FIG. 8(a)), transistor 1b is turned off. Simultaneously, Vxa converges at Vx given by equation (14), and Vxb converges at source voltage $V_{DD}$ (FIG. 8(b)). This state is maintained by transistor 3b which is turned on by Vxa (= Vx) and transistor 3a which is turned off by Vxb (= $V_{DD}$). Therefore, current $I_{out}$ of output terminal 100a becomes $I_{out}$ and current $I_{out\ b}$ of output terminal 100b becomes 0.

As described above, in the third embodiment shown in FIG. 5, even if a skew is produced in complementary signals and a period when both of the complementary signals become H levels appears, the influence on an operation of a current source circuit can be suppressed. The operation described above can be easily implemented, as well as above-mentioned implementation of the operation of transistors 1a and 1b in a non-constant current region, by reducing bias potential of bias voltage source or making channel width of transistors 2a and 2b narrower, on the premise that Vx is a voltage low enough to turn on transistors 3a and 3b. In other words, a drive of transistors 3a and 3b by Vx and an operation of transistors 1a and 1b in a non-constant current region can be easily implemented without contradiction.

Dashed lines in timing diagrams of FIGS. 8(b) and 8(c) show changes of voltage and current in another structure (for example, when a skew is produced in complementary signals in the embodiment shown in FIG. 4), and Vxb' and $I_{out\ b'}$ show source potential and output current in the structure, respectively.

Therefore, if a skew is produced in complementary signals in such a structure as shown in FIG. 4, a total amount of output currents ($I_{out\ a} + I_{out\ b'}$ of FIG. 8(c)) obtained at output terminals 100a and 100b changes largely, resulting in occurrence of noises. However, such large change of total output current amount, that is, occurrence of noises can be prevented by adopting such structure as shown in FIG. 5.

In the fourth embodiment shown in FIG. 6, transistor 1a has its gate connected to the drain of transistor 1b and transistor 1b has its gate connected to the drain of transistor 1a. Other than that, this embodiment is equal to the second embodiment shown in FIG. 4.

Figure 9:
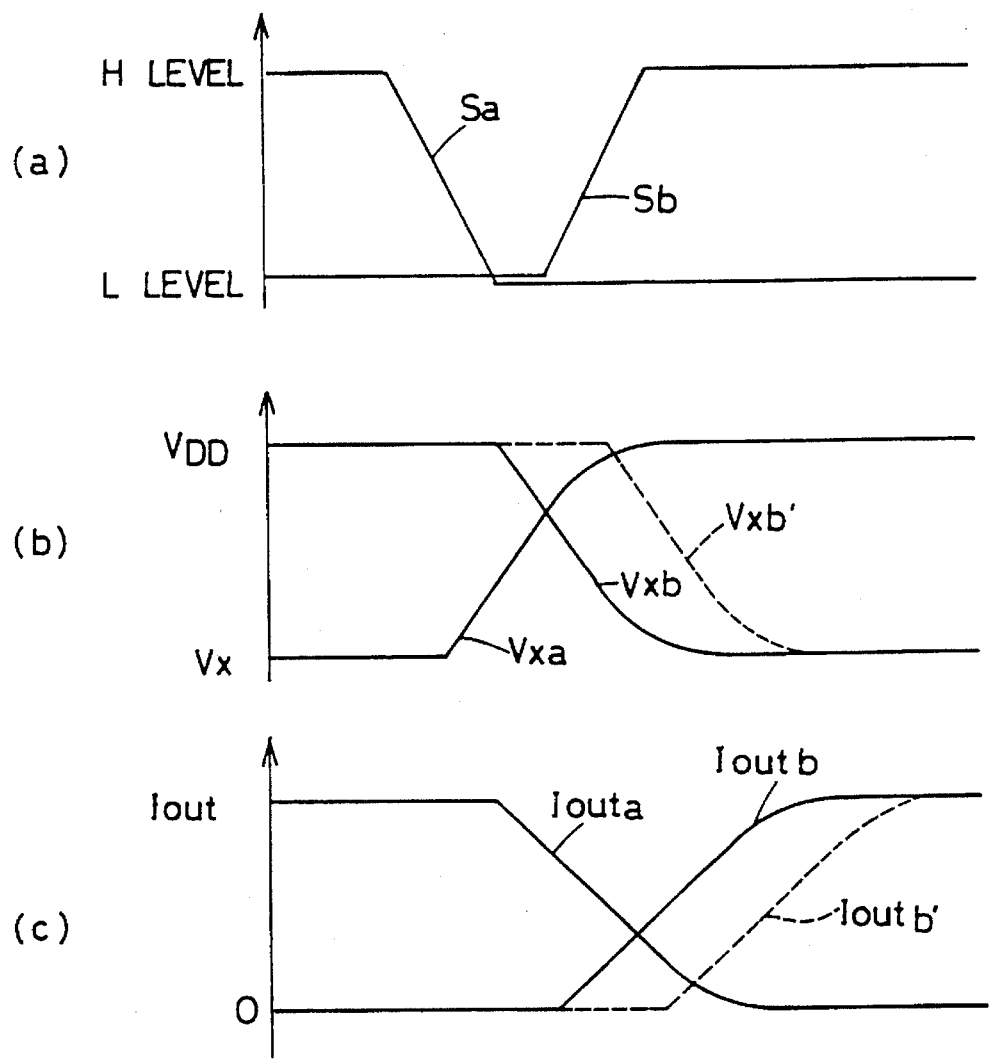
FIG. 9 is a timing diagram explaining an operation of the fourth embodiment of the present invention.

FIG. 9 is a timing chart explaining an operation of the fourth embodiment. An operation of a circuit shown in FIG. 6 will first be described with reference to FIG. 9. Each character in FIG. 9 is the same as one in the third embodiment described above.

First, suppose that initially Sa is at an H level and Sb at an L level as shown in FIG. 9(a). At this time, transistor 3a is turned off and transistor 3b turned on. As shown in FIG. 9(b), Vxa is Vx given by equation (14) and Vxb is source potential $V_{DD}$. This state is maintained by transistor 1b which is turned off by Vxa (= Vx) and transistor 1a which is turned on by Vxb (= $V_{DD}$). Therefore, current $I_{out\ a}$ of output terminal 100a becomes a predetermined value $I_{out}$ and current $I_{out\ b}$ of output terminal 100b becomes 0.

As shown in FIG. 9(a), when Sa changes to an L level, transistor 3a is turned on to increase Vxa. Since this causes transistor 1b to be turned on, Vxb increases while $I_{out\ b}$ begins to drop, even if Sb is still at an L level. When Sb becomes an H level (FIG. 9(a)), transistor 3b is turned off. Simultaneously, Vxa and Vxb converge at source potentials $V_{DD}$ and Vx given by equation (14), respectively. This state is maintained by transistor 1b which is turned on by Vxa (= $V_{DD}$) and transistor 1a which is turned off by Vxb (= Vx). Therefore, current $I_{out\ a}$ of output terminal 100a becomes 0 and current $I_{out\ b}$ of output terminal 100b becomes $I_{out}$.

As described above, in the fourth embodiment shown in FIG. 6, even if a skew is produced in complementary signals and a period when both of the complementary signals become L levels appears, the influence on an operation of a current source circuit can be suppressed. The operation described above can be easily implemented, as well as above-mentioned implementation of the operation of transistors 1a and 1b in a non-constant current region, by reducing bias potential of bias voltage source 21 or making channel width of transistors 2a and 2b narrower, on the premise that Vx is a voltage low enough to turn on transistors 1a and 1b. In other words, similar to the third embodiment described above, a drive of transistors 3a and 3b by Vx and an operation of transistors 1a and 1b in a non-constant current region can be easily implemented without contradiction. Similarly, dashed lines in timing charts of FIG. 9 show changes of voltage and current in another structure (for example, when a skew is produced in complementary signals in the embodiment shown in FIG. 4).

Figure 7:
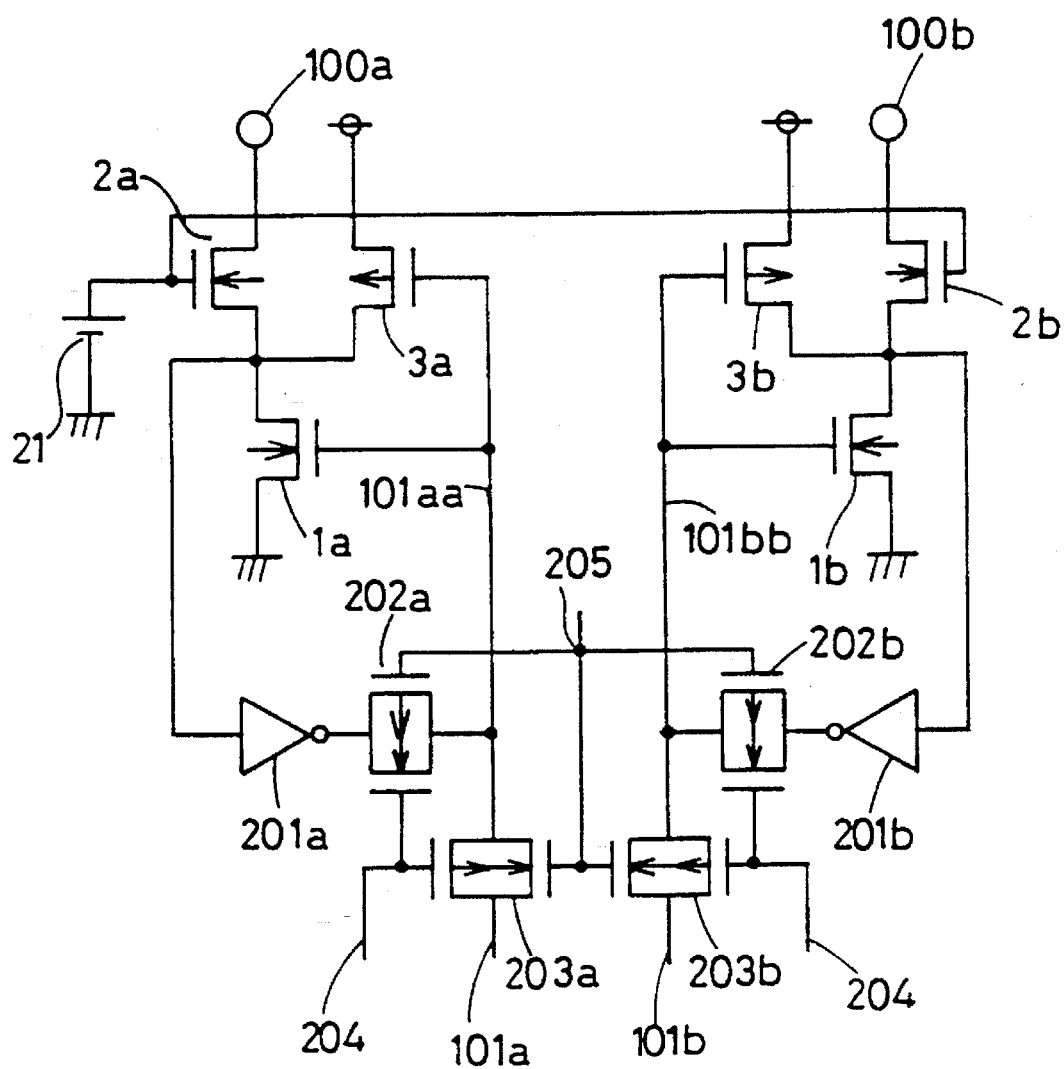
FIG. 7 is a circuit diagram showing a current source circuit according to a fifth embodiment of the present invention.

FIG. 7 is a circuit diagram showing a current source circuit according to a fifth embodiment of the present invention. A current source circuit shown in FIG. 7 is a current source circuit having an object to completely eliminate the influence, even if a large skew is produced in signals. Referring to FIG. 7, respective connection states of transistors 1a, 2a, 3a, 1b, 2b, 3b and bias voltage source 21 are basically the same as the connection states of the second embodiment shown in FIG. 4. Therefore, when potential of node 101aa corresponding to signal line 101a in FIG. 4 is at an H level and potential of node 101bb corresponding to signal line 101b in FIG. 4 is at an L level, a current is obtained from output terminal 100a, and in the opposite case, a current is obtained from output terminal 100b. The structure of the other parts is as follows.

Referring to FIG. 7, inverters 201a and 201b have their input terminals connected to drains of transistors 1a and 1b, respectively, and their output terminals connected to transmission gates 202a and 202b, respectively. The other end of transmission gate 202a is connected to transmission gate 203a and node 101aa and the other end of transmission gate 202b is connected to transmission gate 203b and node 101bb. The other ends of transmission gates 203a and 203b are connected to signal lines 101a and 101b, respectively.

Clock lines 204 and 205 supply clocks of the phases opposite to each other. Clock line 204 is connected to gates of N channel MOS transistors of transmission gates 202a and 202b and gates of P channel MOS transistors of transmission gates 203a and 203b. Clock line 205 is connected to gates of P channel MOS transistors of transmission gates 202a and 202b and gates of N channel MOS transistors of transmission gates 203a and 203b.

Figure 10:
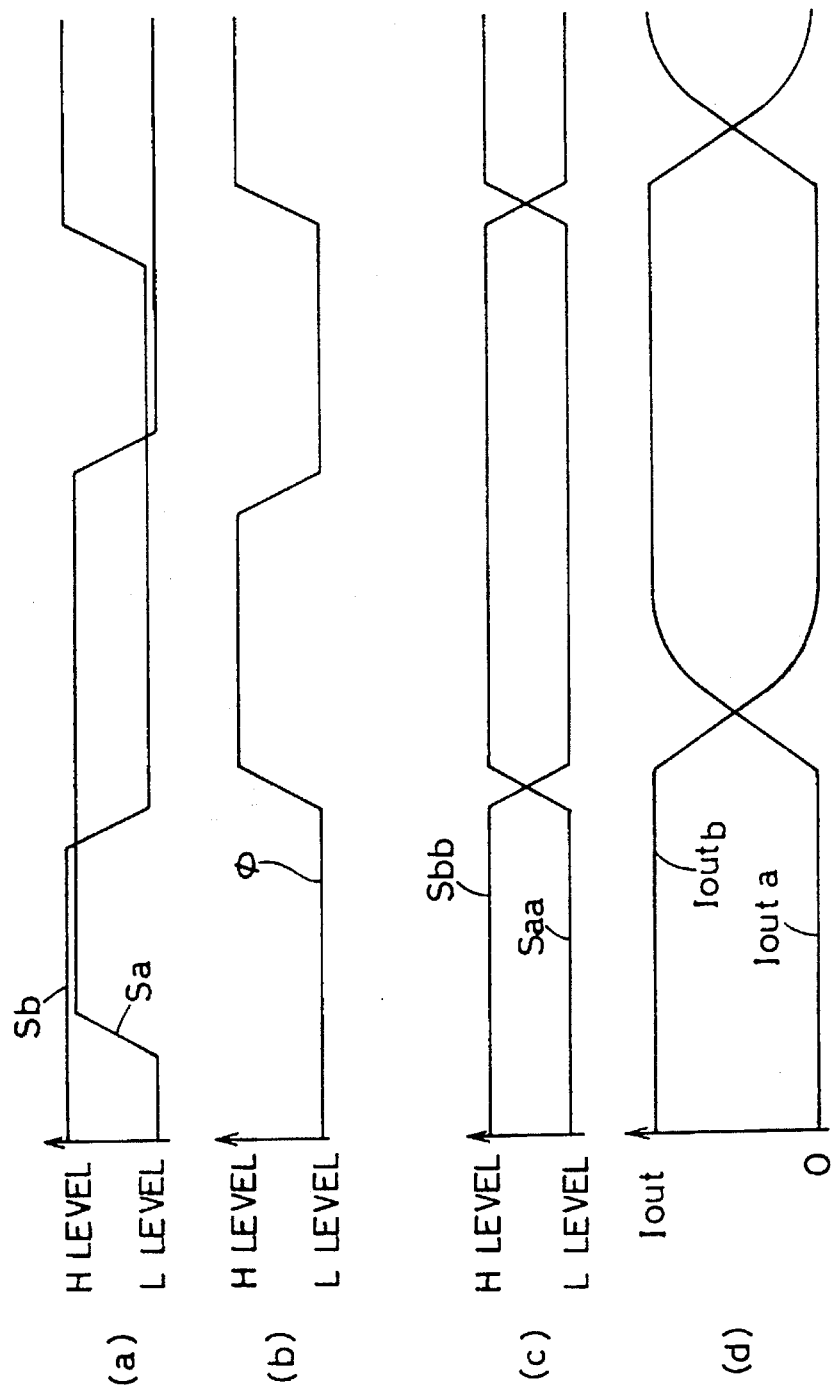
FIG. 10 is a timing diagram explaining an operation of the fifth embodiment of the present invention.

FIG. 10 is a timing diagram explaining an operation of a fifth embodiment shown in FIG. 7. Referring to FIG. 10, φ shows a logic value of a signal on clock signal line 205 and a signal on clock signal line 204 has the phase opposite to φ. Saa is a logic value at node 101aa, and Sbb a logic value at node 101bb. The other characters are the same as those in FIGS. 8 and 9, for example, Sa showing a logic value at signal line 101a.

First, suppose that initially φ is at an L level, node 101aa is at an L level and node 101bb at an H level. At this time, transmission gates 202a and 202b are turned on and transmission gates 203a and 203b turned off. Therefore, signal lines 101a and 101b and nodes 101aa and 101bb are separated, respectively. On the other hand, since node 101aa is at an L level, $I_{out\ a}$ is 0, source potential Vxa of transistor 2a is $V_{DD}$ and an output of inverter 201a is at an L level, which coincides with a logic value of signal line 101aa. Therefore, such a state is maintained by a closed-loop formed of transistors 1a and 3a, inverter 201a and transmission gate 202a.

Since node 101bb is at an H level, output current $I_{out\ b}$ is current value $I_{out}$, source potential Vxb of transistor 1a is Vx given by equation (14) and an output of inverter 201b is at an H level, which coincides with a logic value of signal line 101bb. Therefore, such a state is maintained by a closed-loop formed of transistors 1b and 3b, inverter 201b and transmission gate 202b.

As described above, while signal line 101a and node 101aa are separated and signal line 101b and node 101bb are separated, logic values Saa and Sbb at nodes 101aa and 101bb are maintained. As shown in FIG. 10(a), even if Sa and Sb change their states at different timings at this time, the state of a current source circuit in itself does not change.

Next, as shown in FIG. 10(b), suppose that φ becomes an H level. At this time, transmission gates 203a and 203b are turned on and the above mentioned closed-loop is rendered open. Simultaneously, transmission gates 202a and 202b are turned off, and signals Sa and Sb are transmitted to nodes 101aa and 101bb. Therefore, the moment φ transits from an L level to an H level, as shown in FIG. 10(d), $I_{out\ a}$ and $I_{out\ b}$ begin to change simultaneously and are settled in output states according to logic values Sa and Sb.

As described above, in the fifth embodiment shown in FIG. 7, even if a large skew is produced in logic values Sa and Sb of signal lines during a period when clock φ is at an L level, a current output simultaneously changes in synchronism with a clock without being influenced at all. The operation described above can be easily implemented, as well as implementation of the operation of transistors 1a and 1b in a non-constant current region, by reducing bias potential of bias voltage source 21 or making channel width of transistors 2a and 2b narrower, on the premise that Vx is lower than logic threshold values of inverters 201a and 201b. In other words, similar to the third and the fourth embodiments described above, a drive of transistors 3a and 3b by Vx and an operation of transistors 1a and 1b in a non-constant current region can be easy implemented without contradiction.

Figure 11:
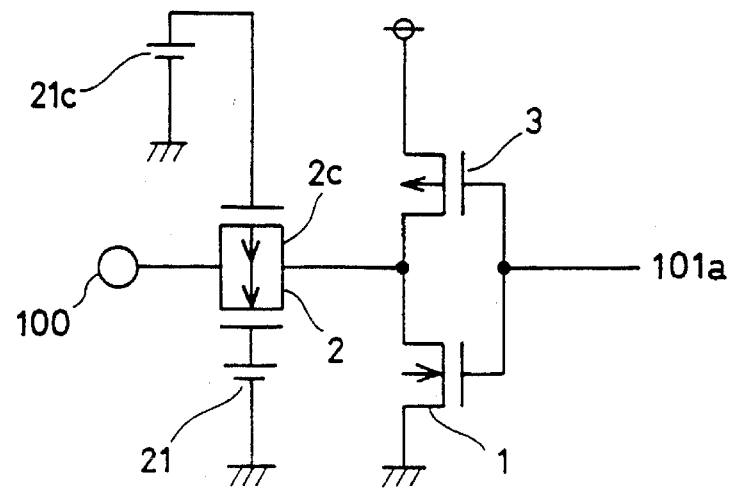
FIG. 11 is a circuit diagram showing a current source circuit according to a sixth embodiment of the present invention.

FIG. 11 is a circuit diagram showing a current source circuit according to a sixth embodiment of the present invention. The sixth embodiment shows a bidirectional current source circuit which can select either of two states where a predetermined current flows out from a current source circuit and where a predetermined current flows into the current source circuit.

Referring to FIG. 11, connection states of N channel MOS transistor 2, N channel MOS transistor 1, P channel MOS transistor 3 and bias voltage source 21 is the same as those of the first embodiment shown in FIG. 1. In addition, P channel MOS transistor 2c has its gate connected to a second bias voltage source 21c, its source connected to the source of transistor 2 and it drain connected to output terminal 100 as well as the drain of transistor 2.

An operation of the embodiment in FIG. 11 will be described hereinafter. When signal line 101a is at an H level, transistor 1 is turned on and transistor 2 turned off. As a result, as described in the description of the first embodiment, current flows into transistors 2 and 1 from output terminal 100. Since transistor 2c is a P channel MOS transistor, drain current of transistor 2c becomes 0 and a current source circuit conducts completely the same operation as one described in the first embodiment, when the following equation holds:

$$Vx < V_G2' + |V_{TH}2'| \quad (17)$$

where Vx is source potential of transistor 2, $V_{TH}2'$ is a threshold value of transistor 2c and $V_G2'$ is a voltage value of bias voltage source 21c.

More specifically, when the following equation holds according to equations (14) and (17), a current path is formed of only transistors 2 and 1.

$$V_G - V_{TH}2 - (2I_{out}/\beta 2)^{1/2} < V_G2' + |V_{TH}2'| \quad (18)$$

In this case, if equation (8) is satisfied simultaneously, a current is made constant by transistor 2 and a flow-in current having constant-current characteristics is obtained.

On the other hand, when signal line 101a is at an L level, transistor 1 is turned off and transistor 2 turned on. As a result, a current flows out of terminal 100 through transistors 3 and 2c. Taking into consideration that transistor 2c is a P channel MOS transistor, the following equation holds as well as equation (14).

$$Vx' = V_G2' + |V_{TH}2'| + (2I_{out'}/\beta 2')^{1/2} \quad (19)$$

where V' is a source potential of transistor 2c, $I_{out'}$ is a desired current at this time and $\beta 2'$ is β of transistor 2c.

On the other hand, at this time, if $$Vx' > V_G2 - V_{TH}2 \quad (20)$$

a drain current of transistor 2 becomes 0. More specifically, when the following equation holds according to equations (19) and (20), a current path is formed of only transistors 2c and 3.

$$V_G2' + |V_{TH}2'| + (2I_{out'}/\beta 2')^{1/2} > V_G2 - V_{TH}2 \quad (21)$$

In the above equation, $V_{outmax}$ is an allowable maximum voltage of an output terminal. Taking into consideration that transistor 2c is a P channel MOS transistor, a current is made constant by transistor 2c and a flow-out current having constant-current characteristics is obtained if the following equation is satisfied as well as equation (8).

$$V_{outmax} < V_G2' + |V_{TH}2'| \quad (22)$$

As described above, when equations (8), (18), (21) and (22) are satisfied, a constant current is obtained in both cases of flow-out and flow-in. Such an operation condition is easily obtained by, for example, making $V_G2$ lower and $V_G2'$ higher. As a result, the operation of transistors 1 and 3 in a non-constant current region can also be implemented and it is preferable also in view of an increase in operation speed of a current source as well as in the above-mentioned embodiments. It is easily implemented to make flow-out current $I_{out}$ coincide with flow-in current $I_{out'}$ by adjusting $V_G2$, $V_G2'$, β2, β2' and the like under conditions described above.

Figure 12:
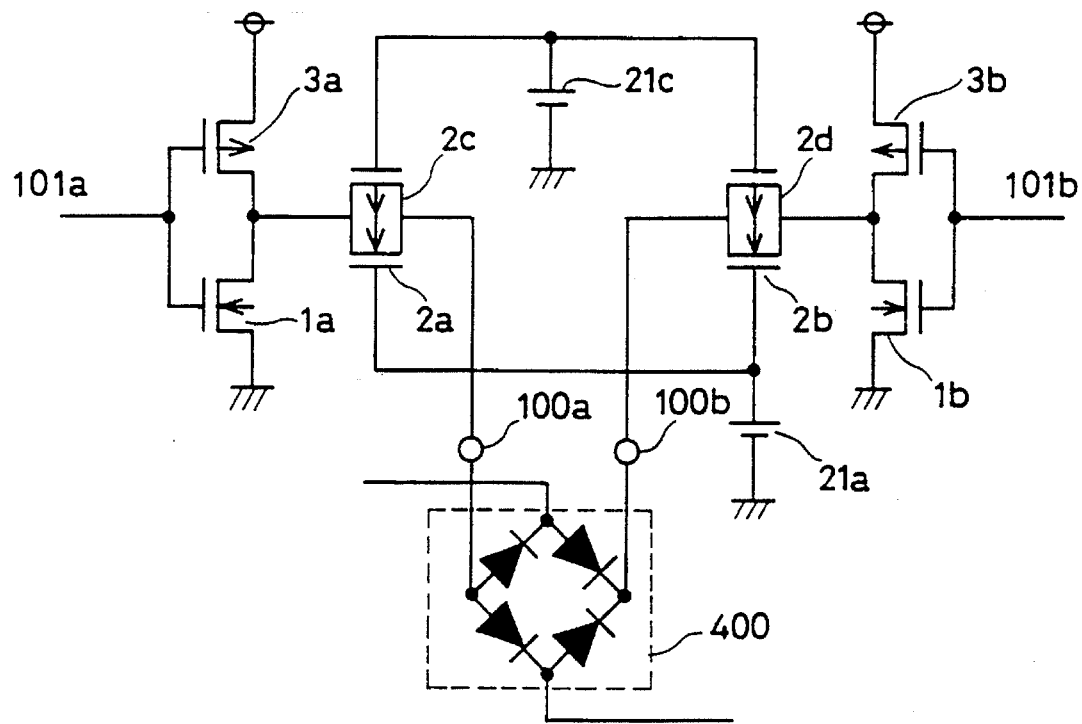
FIG. 12 is a circuit diagram showing a current source circuit according to a seventh embodiment of the present invention.
Figure 13:
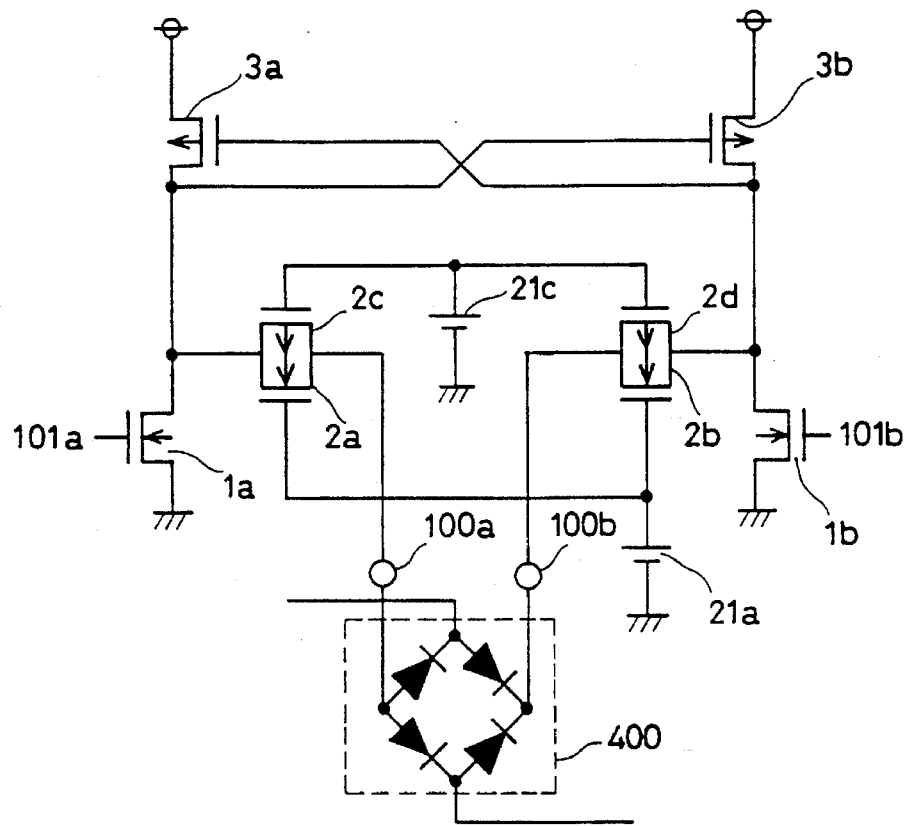
FIG. 13 is a circuit diagram showing a current source circuit according to an eighth embodiment of the present invention.

FIGS. 12 and 13 are circuit diagrams showing a seventh embodiment and an eighth embodiment of the present invention, respectively. The seventh and the eighth embodiments of the present invention relate to current source circuits each enabling complementary and bidirectional supplies of an output current by connecting transistors having different conductivity types from those of output transistors 2, 2a and 2b described in the first to the sixth embodiments described above in parallel with these transistors and by connecting a new bias voltage source to their gates.

Referring to FIGS. 12 and 13, transistors 2c and 2d having a different conductivity type from that of transistors 2a and 2b are connected in parallel with transistors 2a and 2b, respectively, and the gates of transistors 2c and 2d are commonly connected to bias voltage source 21c. This configuration renders transistors 1a, 2a, 3b and 2d conductive when signal line 101a is at an H level and signal line 101b at an L level. Therefore, a current flows out from output terminal 100b and a current is drawn into from output terminal 100a.

When signal line 101a is at an L level and signal line 101b at an H level, transistors 3a, 2c, 1b and 2b are rendered conductive. Therefore, a current flows out of output terminal 100a and a current is drawn into from output terminal 100b. Such a current source circuit is suitable for driving, for example, a diode bridge 400.

Figure 14:
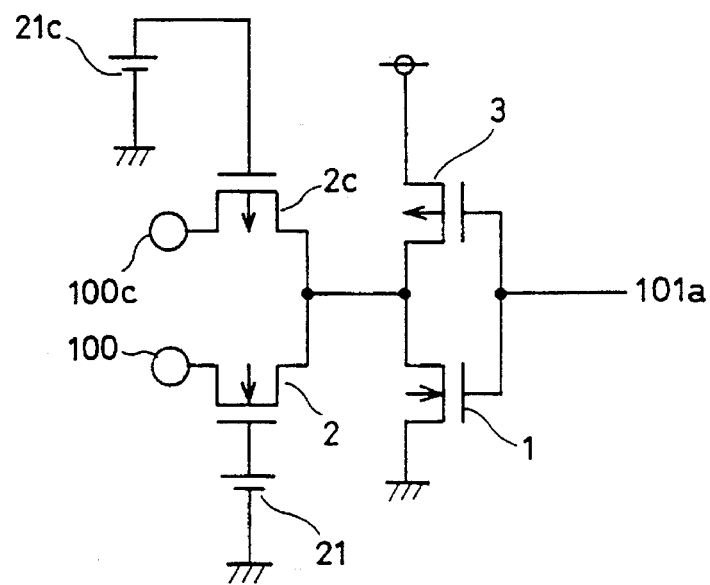
FIG. 14 is a circuit diagram showing a current source circuit according to a ninth embodiment of the present invention.

FIG. 14 is a circuit diagram showing a ninth embodiment which is a modification of the above embodiments. Output terminals supplying current are separated as in the case of a terminal 100 and a terminal 100c. In other words, when signal line 101a is at an H level, a flow-in current is obtained from terminal 100 and when signal line 101a is at an L level, a flow-out current is obtained from terminal 100c. When output terminal is not separated as in FIG. 14, it is required that an allowable voltage range of terminal 100 satisfy equations (8) and (22) simultaneously. However, in FIG. 14, it is only required that voltage of terminal 100 satisfy equation (8) and that voltage of terminal 100c satisfy equation (22).

Transistors 1 and 3 in the first embodiment shown in FIG. 1 can be taken as an inverter which is a logic circuit. Therefore, it is possible to constitute a current source circuit having various functions by incorporating transistors 1 and 3 into another logic circuit.

Figure 15:
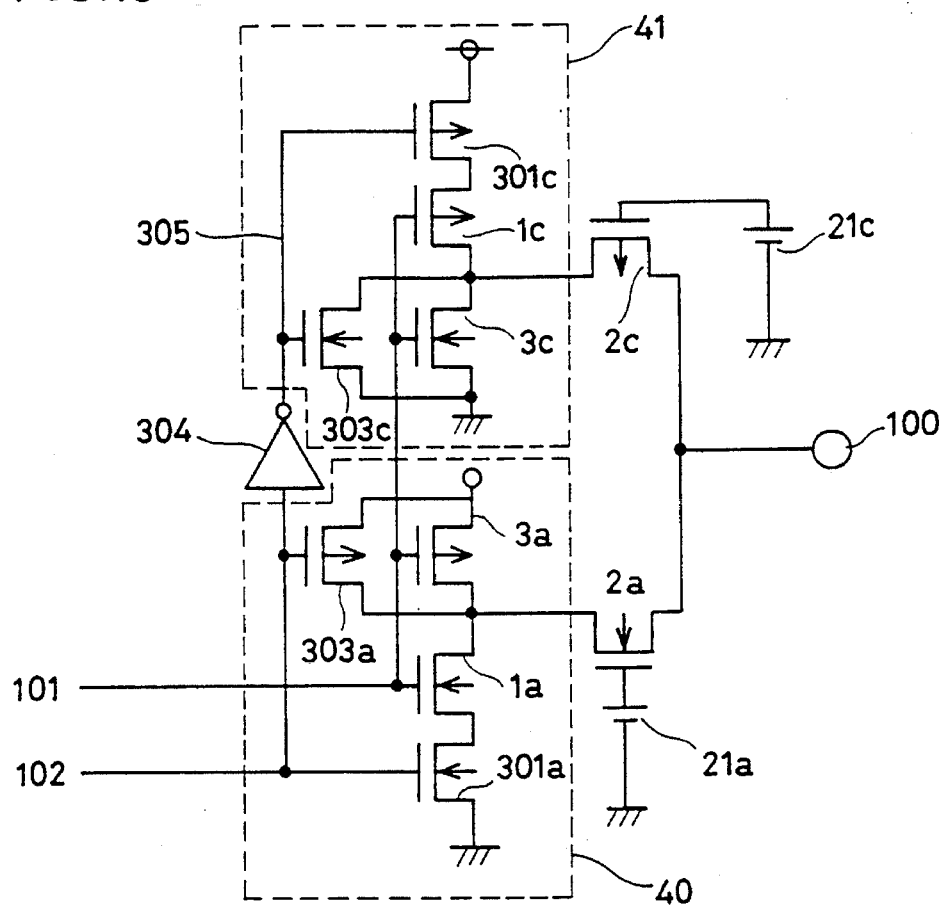
FIG. 15 is a circuit diagram showing a current source circuit according to a tenth embodiment of the present invention.

FIG. 15 is a circuit diagram showing a current source circuit which is a tenth embodiment of the present invention. FIG. 15 shows a configuration of a three-state current source circuit where any one of three states can be selected where a predetermined current flows out from the current source circuit, flows in the current source circuit and no current flows out or into. In other words, the source of N channel MOS transistor 2a, the drain of N channel MOS transistor 1a and the drain of P channel MOS transistor 3a are connected to a common node. The gate of transistor 2a is connected to bias voltage source 21a. The source of P channel MOS transistor 2c, the drain of P channel MOS transistor 1c and the drain of N channel MOS transistor 3c are connected to a common node. The gate of transistor 2c is connected to bias voltage source 21c.

On the other hand, transistors 1a and 3a constitute an NAND gate 40 together with an N channel MOS transistor 301a and a P channel MOS transistor 303a. Transistors 1c and 3c constitute an NOR gate 41 together with a P channel MOS transistor 301c and an N channel MOS transistor 303c.

Drains of transistors 2a and 2c are commonly connected to output terminal 100. A signal line 102 is directly input to NAND gate 40 and to an inverter 304. An output 305 of inverter 304 is input to NOR gate 41. Respective other inputs of NAND gate 40 and NOR gate 41 are commonly connected to signal line 101.

An operation of a current source circuit shown in FIG. 15 will now be described. First, consider current flowing in transistor 2a. When both signal lines 101 and 102 are at H level, both transistors 1a and 301a are turned on and both transistors 3a and 303a are turned off. As a result, source potential Vxn of transistor 2a drops to Vx expressed in equation (14) and a current flows in a path of transistors 2a, 1a and 301a from terminal 100. When logic values of signal lines 101 and 102 take values other than that, one or both of transistors 1a and 301a are turned off and one or both of transistors 3a and 303a turned on. As a result, source potential Vxn of transistor 2a increases to $V_{DD}$ and current flowing in terminal 100 becomes 0.

Next, consider current flowing in transistor 2c. When both signal line 101 and output 305 of inverter 304 are at an L level, both transistors 1c and 301c are turned on and both transistors 3c and 303c turned off. As a result, source potential Vxp of transistor 2c increases to Vx' expressed by equation (19) and a current flows in a path of transistors 301c, 1c and 2c from terminal 100. When logic values of signal line 101 and output 305 of inverter 304 take values other than that, one or both of transistors 1c and 301c are turned off and one or both of transistors 3c and 303c turned on. As a result, source potential Vxp of transistor 2c drops to a ground potential (=0) and current flowing in terminal 100 becomes 0.

FIG. 21 shows a table summarizing operations described above. In the table, S101 and S102 show logic values of signal lines 101 and 102, respectively, and S305 shows a logic value of node 305. As apparent from the table of FIG. 21, S101 is a signal controlling a current direction and S102 is a signal controlling on/off of a current. As described above, according to the tenth embodiment of the present invention, a current source circuit having a special function can be easily implemented by merging, as part of a logic circuit, transistors, such as transistors 1a, 3a, 1c, 3c and the like, of conductivity types different from each other for on/off controlling a current source.

Figure 16:
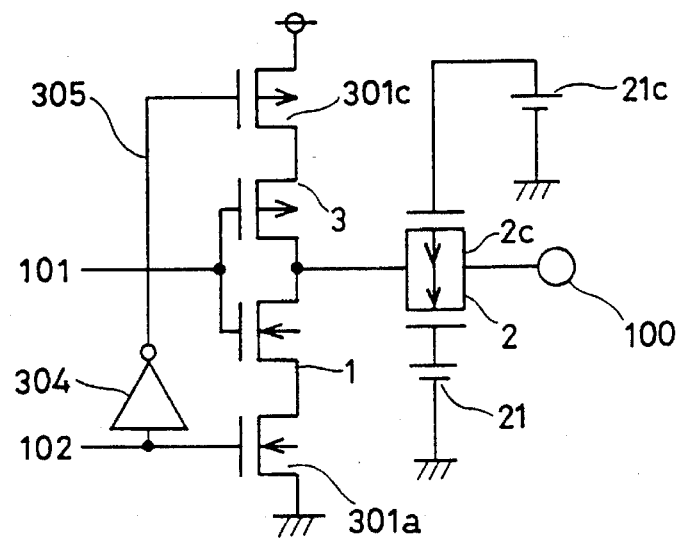
FIG. 16 is a circuit diagram showing a current source circuit according to an eleventh embodiment of the present invention.

A three-state current source circuit as described above is obtained also by improving a bidirectional current source circuit according to the present invention represented by a circuit shown in FIG. 11. FIG. 16 is a circuit diagram showing an eleventh embodiment of the present invention as one example of such a circuit. Referring to FIG. 16, the source of transistor 1 is grounded through an N channel MOS transistor 301a. The source of transistor 3 is connected to a voltage source potential through P channel MOS transistor 301c. Signal line 102 is connected to the gate of transistor 301a and to an input of inverter 304. Output terminal 305 of inverter 304 is connected to the gate of transistor 301c. The configuration other than that is similar to that of the first embodiment of FIG. 1.

An operation of the embodiment of FIG. 16 will now be described. When signal line 102 is at an H level, both of transistors 301a and 301c are turned on. If signal line 101 is at an H level at this time, transistor 1 is turned on and transistor 3 turned off. As a result, source potential of transistor 2 (consequently, source potential of transistor 2c) drops to Vx expressed by equation (14) and a current flows in a path of transistors 2, 1 and 301a from terminal 100.

Similarly, when signal line 102 is in at H level, if signal line 101 is at an L level, transistor 1 is turned off and transistor 3 turned on. As a result, source potential of transistor 2 increases to Vx' expressed by equation (19) and a current flows into terminal 100 from a path of transistors 301c, 3 and 2c. When signal line 102 is at an L level, both transistors 301a and 301c are turned off. Therefore, regardless of a logic value of signal line 101, current flowing in terminal 100 becomes 0.

Figure 17:
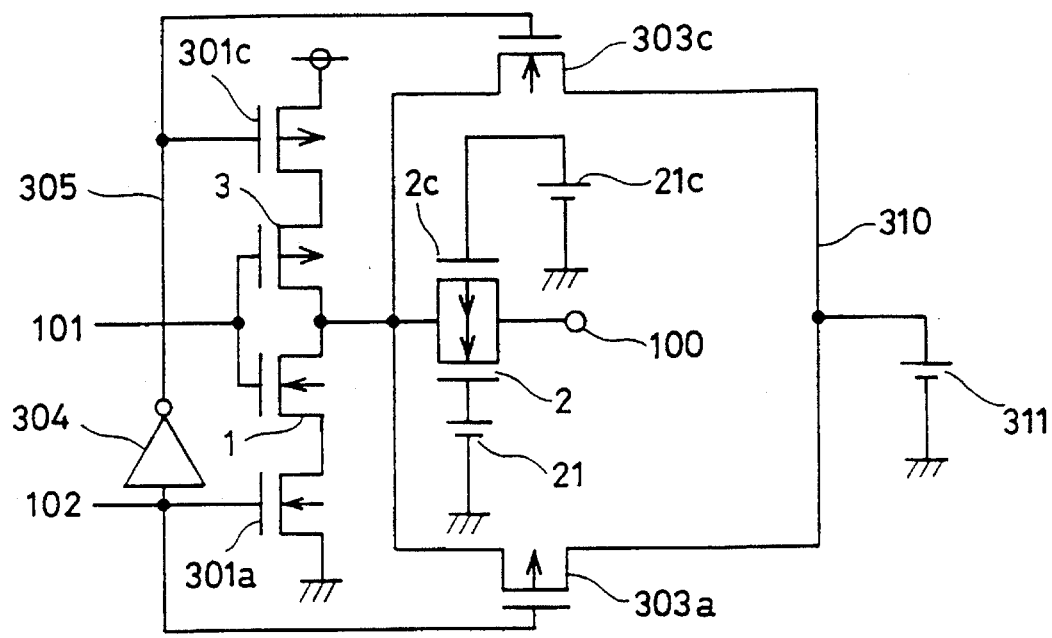
FIG. 17 is a circuit diagram showing a current source circuit according to a twelfth embodiment of the present invention.

When signal line 102 becomes an L level from an H level, the source of transistor 2 is charged or discharged by transistor 2 or transistor 2c. To accelerate this charge/discharge, a transistor for charge/discharge such as N channel MOS transistor 303c and P channel MOS transistor 303a of FIG. 17 may be connected between the source of transistor 2 and node 310 satisfying the following equation:

$$V_G2 - V_{TH}2 < V_{310} < V_G2' + |V_{TH}2'| \qquad (23)$$

where $V_G2'$ and $V_{TH}2$ are gate potential and a threshold value of transistor 2, respectively, and $V_G2'$ and $V_{TH}2'$ are a gate potential and a threshold value of transistor 2c, respectively. When signal line changes from an H level to an L level, these transistors are turned on and charge/discharge of the source of the transistor 2 is accelerated. If equation (23) is satisfied, such an inconvenience that current flows to terminal 100 through transistors 2 and 2c from node 310 after charge/discharge does not occur. Therefore, although voltage source 311 is connected to node 310 in this embodiment, node 310 may be connected to bias voltage sources 21 and 22 or output terminal 100.

A configuration example of bias voltage sources 21 and 21c used in each embodiment described above will now be described. One of the simplest configurations is a configuration where resistors are serially connected between voltage source potential and ground potential and the connection point of the resistors is fetched as an output of bias voltage source. Although various examples can be considered as other examples, some of the examples will be described hereinafter with reference to FIGS. 18 to 20.

Figure 18:
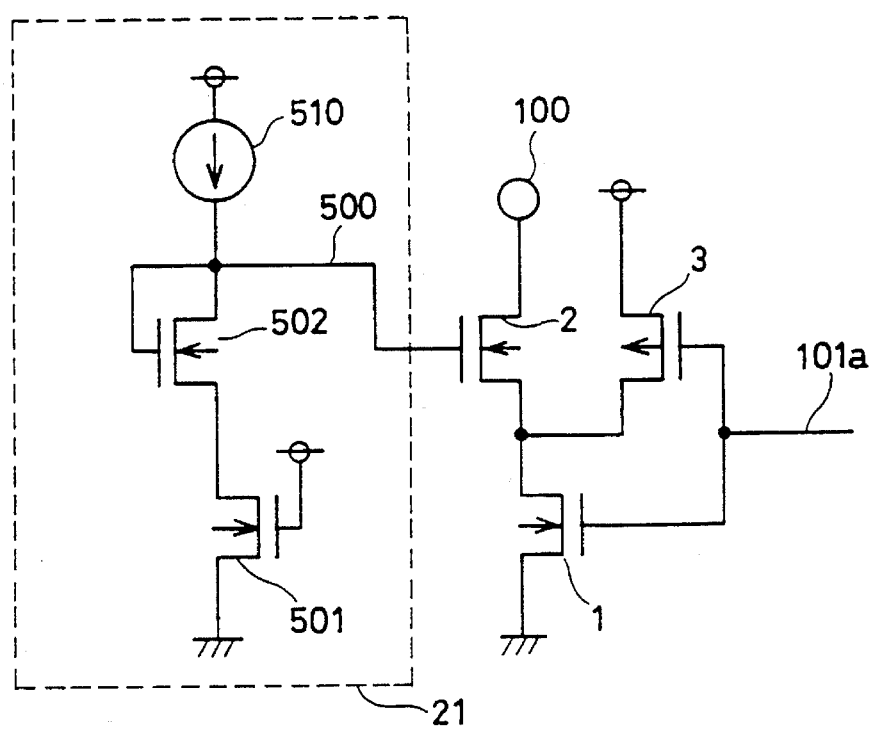
FIG. 18 is a circuit diagram showing a first structure of a bias voltage source suitable for the present invention.

FIG. 18 shows a configuration of bias voltage source 21 when a desired output current $I_{out}$ is to be obtained. Bias voltage source 21 of FIG. 18 is provided with: a reference current source 510 having an amount of output current IR; an N channel MOS transistor 501, where β is β1R and a threshold value is $V_{TH}1$ as well as that of transistor 1; and an N channel MOS transistor 502 wherein β is β2R and a threshold value is $V_{TH}2$ as well as that of transistor 2. A current source circuit is connected to the gate and drain of transistor 502, the source of transistor 502 is connected to the drain of transistor 501, the source of transistor 501 is connected to the same potential as the source of transistor 1, that is, ground potential and the gate of transistor 501 is connected to potential corresponding to an H level of signal line 101a, that is, voltage source potential $V_{DD}$.

The gate of transistor 502 is connected to the gate of transistor 2 as an output 500 of bias voltage source. In this circuit, gate voltage of transistor 502 is settled to a voltage which flows reference current IR. Since gates of transistors 502 and 2 are connected to each other, and since gate potentials of transistors 501 and 1 becomes equal to each other when signal line 101a is at an H level, assuming here that, for example, β1 and β2 are βs of transistors 1 and 2, respectively, and that:

$$β1/β1R=β2/β2R=M1 \qquad (24)$$

output current $I_{out}$ when a current source circuit is turned on becomes:

$$I_{out}= M1IR \qquad (25)$$

therefore, a desired $I_{out}$ is obtained by adjusting IR.

Figure 19:
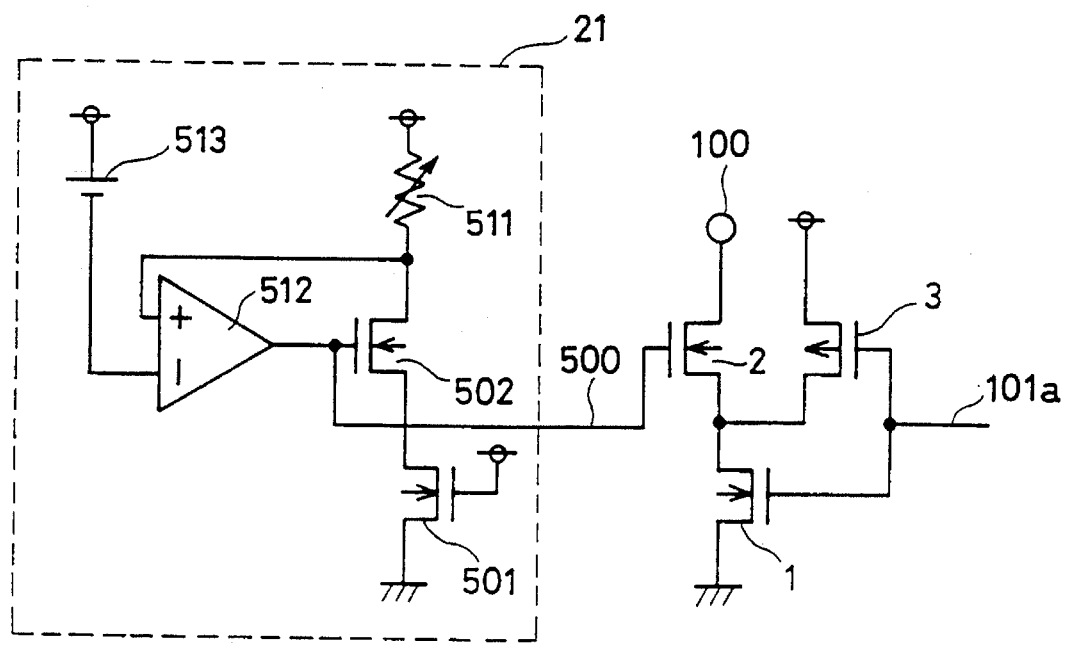
FIG. 19 is a circuit diagram showing a second structure of a bias voltage source suitable for the present invention.

FIG. 19 shows an example having a further improvement added to generation of the above-described reference current. A variable resistor 511 has one end connected to voltage source potential and the other end connected to the drain of transistor 502. Voltage source 513 of such as a bad gap reference having an output invariable for temperature and source voltage variations, has one end connected to voltage source potential and the other end connected to a negative input end of an operational amplifier 512. A positive input end of operational amplifier 512 is connected to the drain of transistor 502, an output end of operational amplifier 512 is connected to the gate of transistor 502 and to the gate of transistor 2 as an output portion 500 of bias voltage source. In this circuit, when output potential of operational amplifier increases, potential of the drain of transistor 502, that is, potential of a positive input end of operational amplifier drops. Therefore, a negative feedback is formed and the gate potential of transistor 502 is adjusted so that potentials of positive and negative input ends of an operational amplifier become equal to each other. At this time, reference current IR flowing in variable resistor 511 is expressed by the following equation.

$$IR= VR/R \qquad (26)$$

where VR is the voltage of voltage source 513 and R is a resistor value of variable resistor 511.

Since gates of transistors 502 and 500 are connected, and since gate potentials of transistors 501 and 1 become equal when signal line 101a is at an H level, output current $I_{out}$ is expressed by the following equation, if, for example, equation (24) holds.

$$I_{out}=M1IR=M1VR/R \qquad (27)$$

Therefore, a desired $I_{out}$ is obtained by adjusting resistance value R of variable resistor 511. In this example, since VR has an output which is invariable for temperature and source voltage variations, at least output current $I_{out}$ is invariable for a source voltage variation. If a resistor having resistance value RL is connected to output terminal 100 of a current source circuit as a load resistor, voltage drop $V_{out}$ of a load register which occurs when a current source circuit is turned on becomes:

$$V_{out}=I_{out}RL=M1VRRL/R \qquad (28)$$

However, when RL has the same temperature characteristics as those of R, $V_{out}$ becomes invariable regardless of the temperature.

Figure 20:
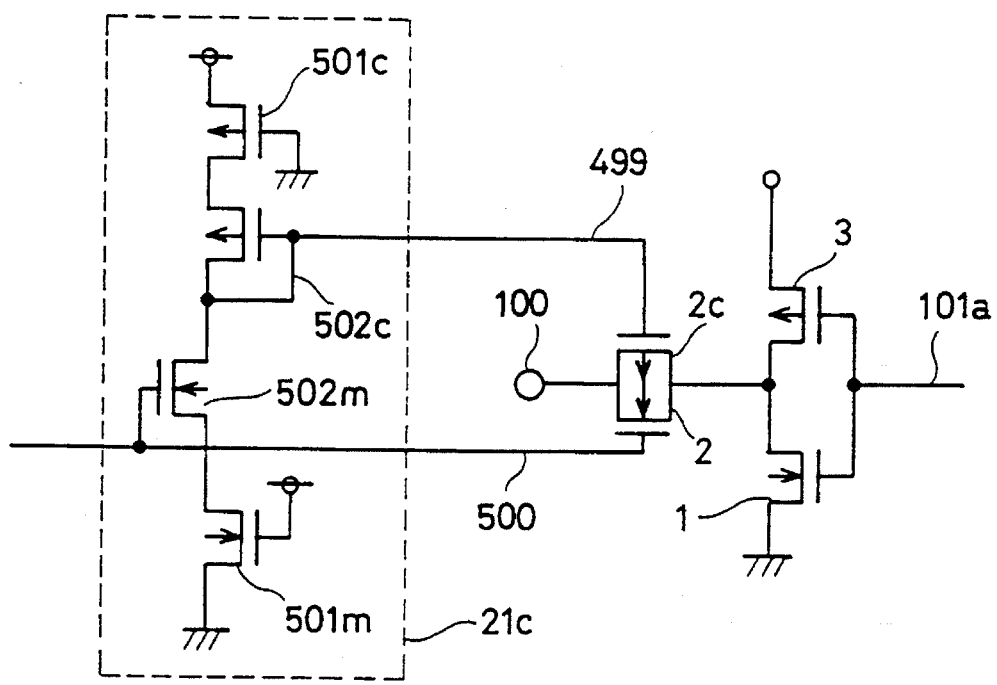
FIG. 20 is a circuit diagram showing a third structure of a bias voltage source suitable for the present invention.
Figure 22:
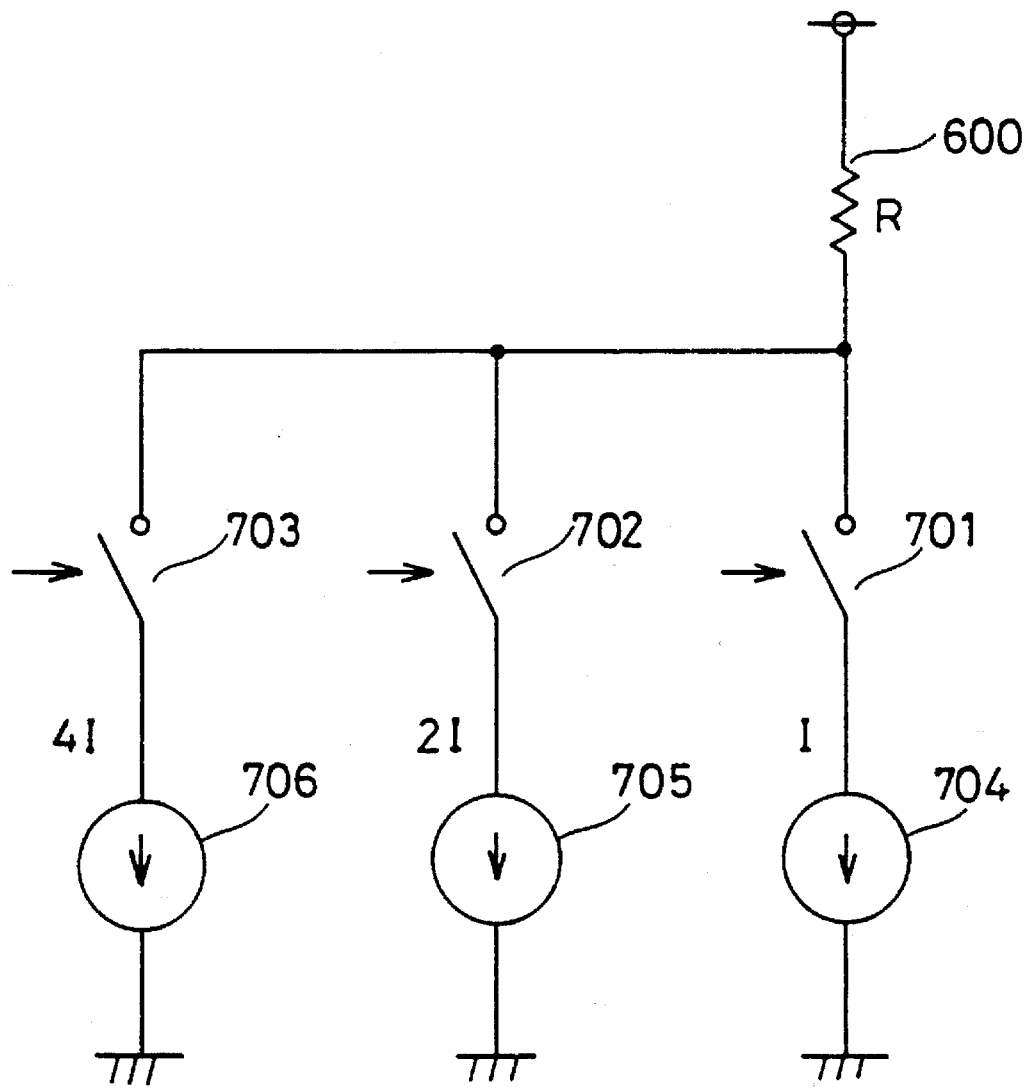
FIG. 22 is a circuit diagram showing an example of a D/A converter using conventional current source circuits.
Figure 23:
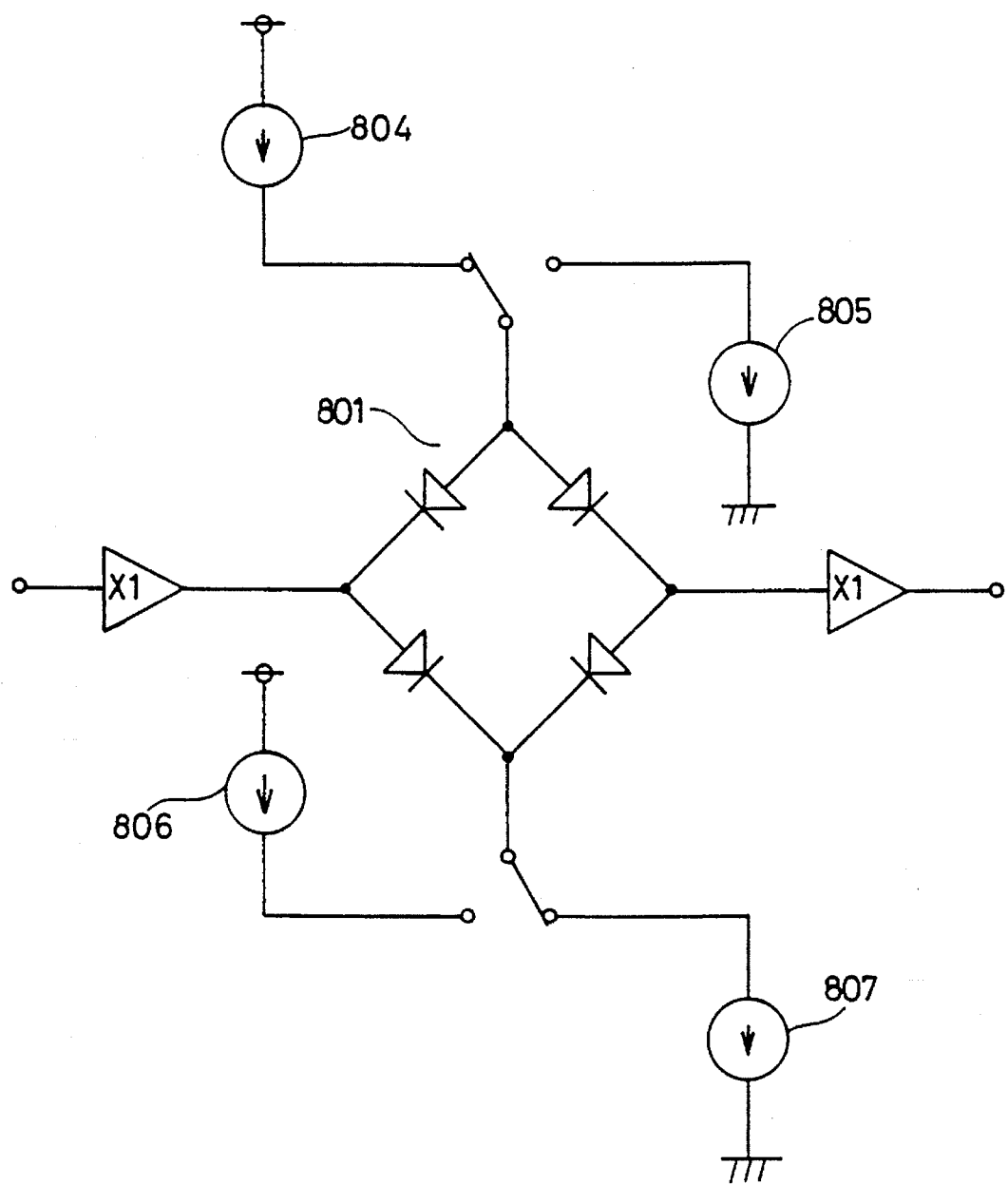
FIG. 23 is a circuit diagram showing an example of a sample and hold circuit using conventional current source circuits.

FIG. 20 shows a configuration example of bias voltage source 21c to make equal current values of a flow-out current and a flow-in current of a bidirectional current source or a three-state current source. Bias voltage source 21c is provided with: an N channel MOS transistor 501m, wherein β is β1m and a threshold value is $V_{TH}1$ as well as that of transistor 1; an N channel MOS transistor 502m, wherein β is β2m and a threshold value is $V_{TH}2$ as well as that of transistor 2; a P channel MOS transistor 501c, wherein β is β1c and a threshold value is $V_{TH}1'$ as well as that of transistor 3; and a P channel MOS transistor 502c, wherein β is β2c and a threshold value is $V_{TH}2'$ as well as that of transistor 2c.

The drain of transistor 502m is connected to the gate and drain of transistor 502c and forms an output 499 of bias voltage source 21c. The source of transistor 502c is connected to the drain of transistor 501c, the source of transistor 501c is connected to the same potential as that of the source of transistor 3, that is, a voltage source potential and the gate of transistor 501c is connected to potential corresponding to an L level of signal line 101a, that is, ground potential. Input 500 of bias voltage source 21 as described above is connected to the gate of transistor 502m and the gate of transistor 2. The source of transistor 502m is connected to the drain of transistor 501m, the source of transistor 501m is connected to the same potential as that of the source of transistor 1, that is, ground potential and the gate of transistor 501m is connected to potential corresponding to an H level of signal line 101a, that is, voltage source potential $V_{DD}$. Since gates of transistors 502m and 2 are connected, and since gate potentials of transistors 501m and 1 become equal to each other when signal line 101a is at an H level, assuming that, for example, β1 and β2 are βs of transistors 1 and 2, respectively, and that:

$$β1/β1m=β2/β2m=M2 \qquad (29)$$

the relation between flow-in current $I_{out}$ and drain current Im of transistor 502m when signal line 101a is at an H level is expressed by the following equation:

$$I_{out}=M1Im \qquad (30)$$

Therefore, gate voltage of transistor 502c is settled to voltage which flows current Im. On the other hand, since gates of transistors 502c and 2c are connected, and since gate potentials of transistors 501c and 1 become equal to each other when signal line 101a is at an L level, assuming that, for example, β1' and β2' are βs of transistors 3 and 2c, respectively, and that:

$$β1'/β1c=β'/β2c=m3 \qquad (31)$$

the relation between flow-out current $I_{out'}$ and current Im when signal line 101a is at an L level is expressed by the following equation:

$$I_{out'} = M31m \quad (32)$$

Therefore, according to equations (29) and (30)

$$I_{out'} = (M3/M2)I_{out} \quad (33)$$

is given, and it is possible to make flow-out current $I_{out'}$ and flow-in current $I_{out}$ equal to each other by setting β1m, β2m, β1c and β2c so as to become (M3/M2)=1.

The combination of transistors 1 and 3 in each of FIGS. 1, 3, 11 and 14 can be regarded as an inverter. Similarly, the combination of transistors 1a and 3a and the combination of transistors 1b and 3b in each of FIGS. 2, 7 and 12 can be regarded as inverters. As described in the foregoing, transistors 1a and 3a and transistors 1c and 3c can be regarded as transistors partially constituting NAND gate 40 and transistors partially constituting NOR gate 41, respectively. Similarly, according to the present invention, any circuit corresponding to a logic gate can be formed by appropriately adding other transistors to transistors 1 and 3. Accordingly, a current source circuit whose output is turned on or off when the applied logic values meet the desired logic can be implemented.

The case should be considered wherein a current source circuit should be turned on or off in accordance with a truth table shown in FIG. 29. This logic is a control logic for a current source circuit usually used in a D/A converter consisting of unit current sources two-dimensionally arranged as described in the aforementioned IEEE Journal of Solid-State Circuit, Vol. SC-21, No. 6, pp. 983–988, December, 1986, and IEICE Technical Report, Paper No. ICD88-6, pp. 39–46, 1988.

Figure 30:
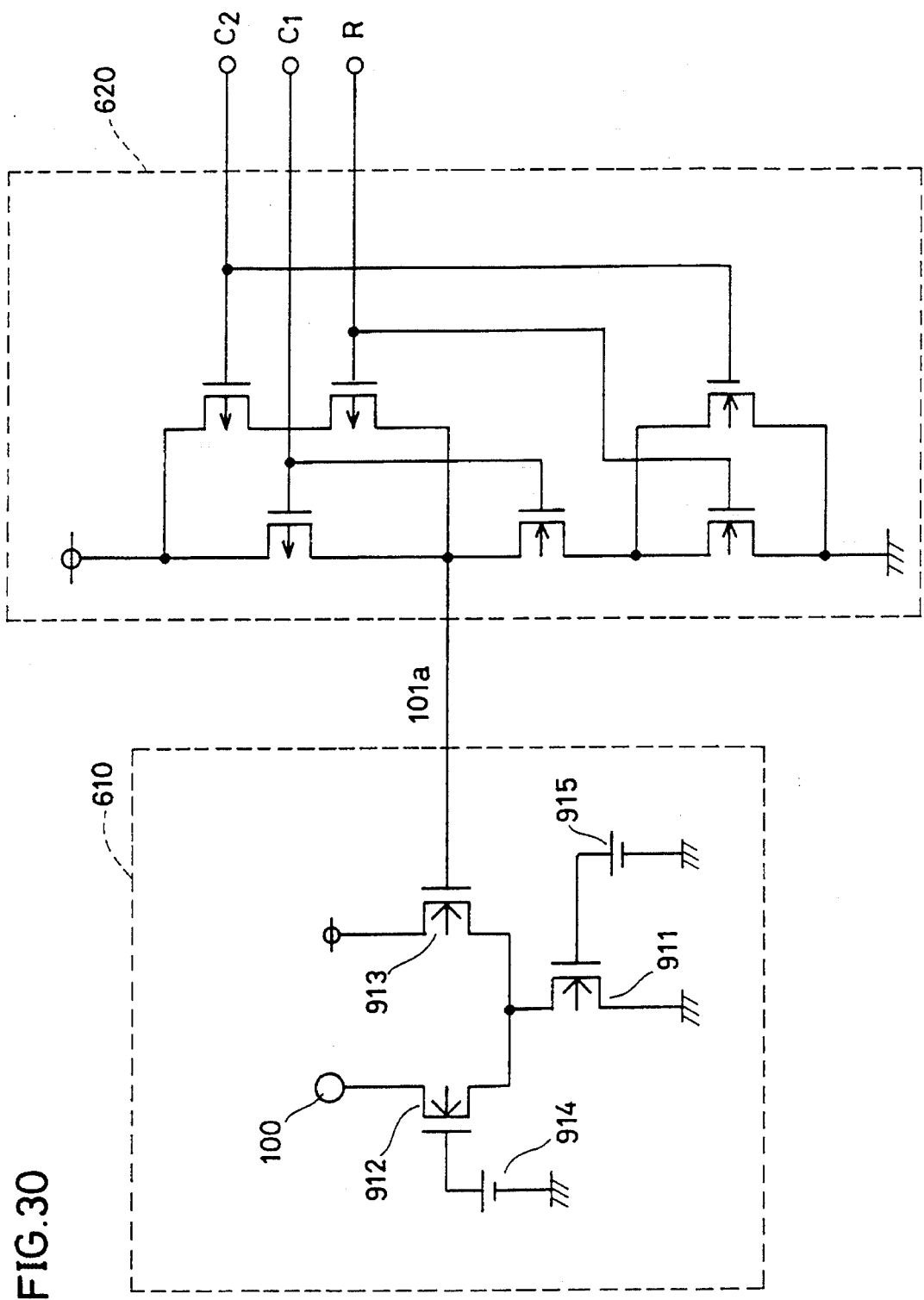
FIG. 30 is a circuit diagram of one example of a control logic circuit for use in the conventional example of FIG. 27.

In the table shown in FIG. 29, inputs C1 and C2 denote two column selecting signals while an input R denotes a row selecting signal. When both C1 and C2 are at an H level, the current source circuit is turned on irrespective of R. On the other hand, when both C1 and C2 are at an L level, the current source circuit is turned off irrespective of R. When C1 and C2 are at H and L levels, respectively, the current source circuit is turned on only if R is at an H level. On the other hand, since inputs C1 and C2 at L and H levels, respectively, are prohibited, an output in this case is "irrelevant", that is, either on or off. When the conventional current source circuit shown in FIG. 27 is used, the easiest way to implement such logic is to use an OR-NAND gate 620 together with the conventional current source circuit 610 and connect an output of gate 620 to a signal line 101a as shown in FIG. 30. Output logic S of OR-NAND gate, that is, a logic value on signal line 101a is also shown in the table of FIG. 29. In this structure, the current source circuit is turned on when S is at an L level.

Figure 31:
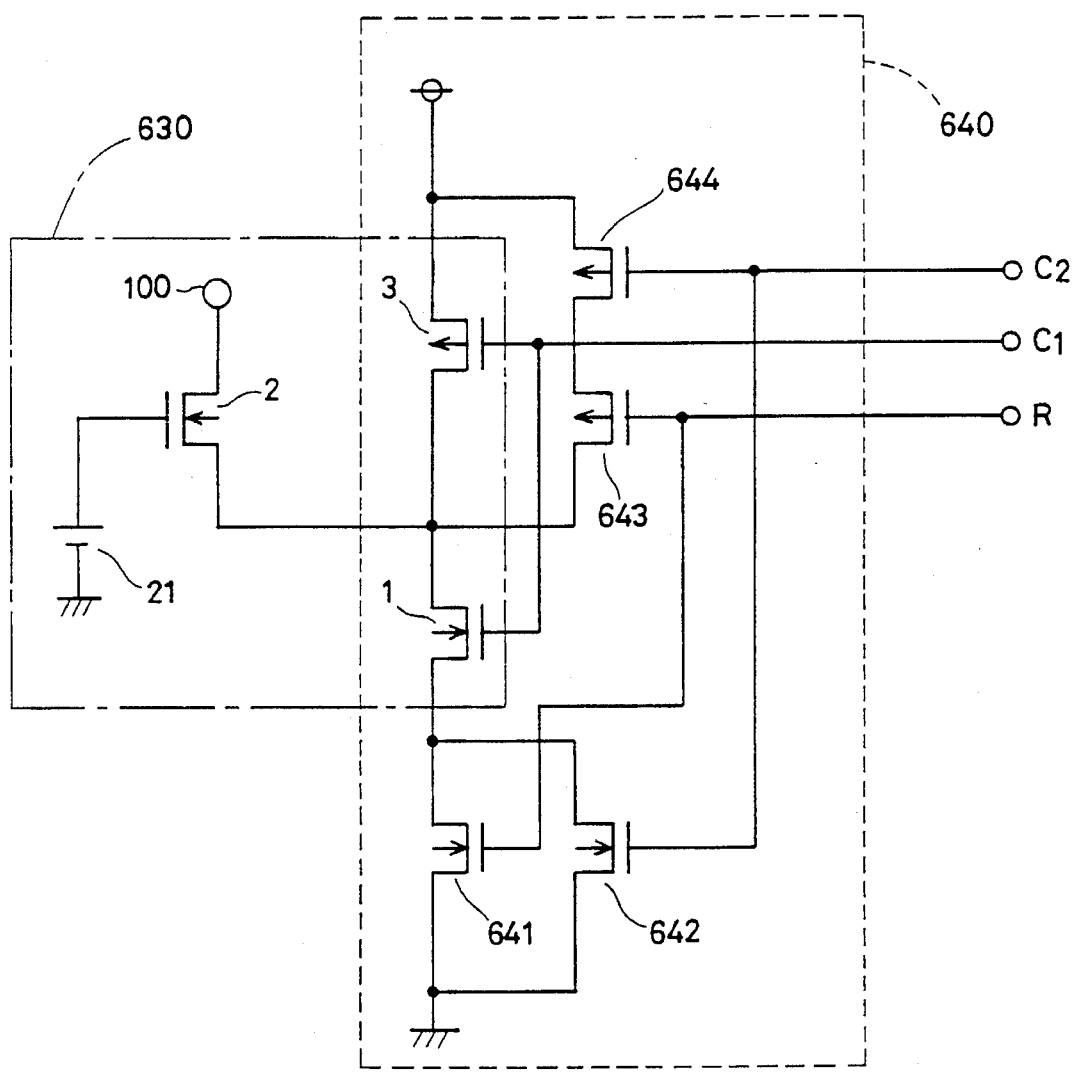
FIG. 31 is a circuit diagram of one example of a control logic circuit for use in the first embodiment of FIG. 1.

According to the present invention, on the other hand, the same function as achieved by such logic circuit and a current source circuit to be driven by the same can be implemented with a smaller number of elements. FIG. 31 is a circuit diagram showing a current source circuit according to an additional embodiment of the present invention.

In FIG. 31, a current source circuit 630 comprising transistors 1, 2 and 3, an output terminal 100 and a bias voltage source 21 is the same as the first embodiment shown in FIG. 1. On the other hand, a circuit 640 comprising transistors 1, 3 and 641–644 surrounded by a broken line is exactly the same as OR-NAND gate 620 shown in FIG. 30. In other words, the current source circuit 630 and the logic gate 640 share transistors 1 and 3 in FIG. 31. In this circuit, when C1 is at an H level and C2 or R is also at an H level, transistor 1 and transistor 641 or 642 are rendered conductive to form a current path from the source of transistor 2 to the ground potential whereby obtaining current at the output terminal 100. When C1, C2 and R take values other than the above values, a current path is formed from the source of transistor 2 to the voltage source to charge the source of transistor 2. As a result, transistor 2 is rendered nonconductive to turn off the current source circuit. Therefore, it can be understood that the function shown in FIG. 29 can also be achieved by this embodiment shown in FIG. 31 and the number of transistors is reduced by two since transistors 1 and 3 are also utilized as a part of the logic circuit 640.

Every type of CMOS logic gate has one or more input terminal and one or more output terminal similarly to the above described OR-NAND gate, and one or more N channel MOS transistor and one or more P channel MOS transistor are necessarily connected to each output terminal. On the other hand, a current path is formed between the output terminal and the ground potential when L level output is to be provided, while a current path is formed between the output terminal and the voltage source potential when H level output is to be provided. Therefore, a portion corresponding to a logic gate can be formed by adding other transistors to transistors 1 and 3 of the present invention. Current is provided or cut off depending on whether the current path from the source of transistor 1 is formed to the ground potential or the voltage source potential.

As described above, the current source circuit whose output is turned on or off when the logic values of inputs meet the desired logic can be implemented by adding other transistors to transistors 1 and 3 to form a circuit portion corresponding to a CMOS logic gate according to the present invention. In comparison with the conventional example wherein a logic portion and a current source circuit portion are separately formed, the total number of transistors can be reduced.

Figure 32:
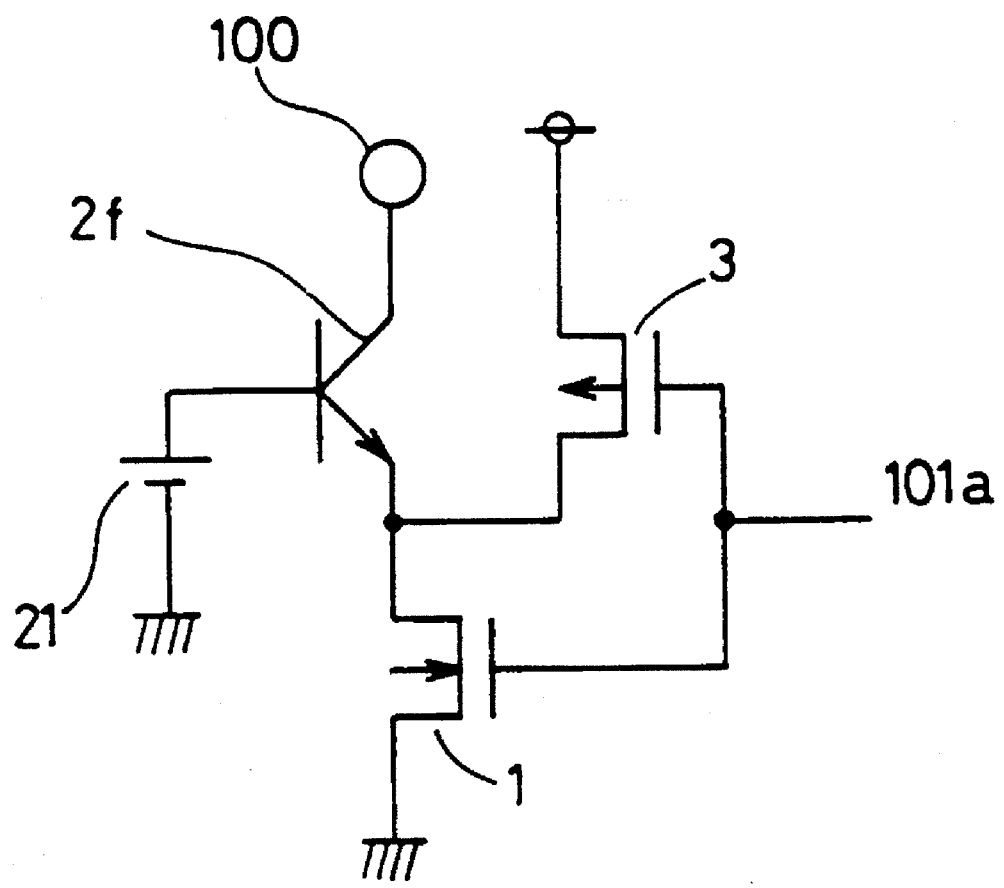
FIG. 32 is a circuit diagram of a modification of the first embodiment wherein an MOS transistor is replaced with a bipolar transistor.

In each of the embodiments described above, in single output type and complementary output type current source circuits, N channel MOS transistors are used as transistors 1, 2, 1a, 2a, 1b and 2b and P channel MOS transistors are used as transistors 3, 3a and 3b. However, if each transistor is configured using a transistor having an opposite conductivity type, the similar effect can be obtained. In addition, in each of the embodiments described above, MOS transistors are used, but Junction FETs (JFETs) may be used and bipolar transistors may also be used. More specifically, an N channel MOS transistor may be replaced with an NPN bipolar transistor or an N channel JFET while a P channel MOS transistor may be replaced with a PNP bipolar transistor or a P channel JFET, resulting in the same effect. FIG. 32 shows one example wherein an N channel MOS transistor is replaced with an NPN bipolar transistor 2f in the first embodiment of FIG. 1.

As described above, in a current source circuit according to the present invention, it is possible to easily reduce the number of devices constituting a current source circuit, increase operation speed of a current source circuit, extend the range of output voltage and make source voltage constant.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A current source circuit, comprising:

first and second transistors establishing a first series current flow path between a source of first constant potential and an output current terminal;

a third transistor of conductivity type opposite that of said second transistor for establishing a second series current flow path between a source of second constant potential and one conduction terminal of said first transistor;

a control electrode of said first transistor receiving a signal of a third constant potential so that said first transistor operates in a constant current region; and control electrodes of said second and third transistors connected to receive a control voltage for controlling a prescribed operating state of said current source.

2. A current source circuit according to claim 1, wherein said second transistor operates in a non-constant current region while said first transistor operates in a constant current region when said second and third constant potentials have a predefined relationship and said control voltage is of a magnitude corresponding to the magnitude of said second constant potential.

3. A current source circuit, comprising:

first and second transistors establishing a first series current flow path between a source of first constant potential and an output current terminal;

a third transistor of conductivity type opposite that of said second transistor for establishing a second series current flow path between a source of second constant potential and one conduction terminal of said first transistor;

a control electrode of said first transistor receiving a signal of third constant potential; and control electrodes of said second and third transistors connected to receive a control voltage for controlling a predetermined operating state of said current source, and further comprising a fourth transistor in said first series current flow path, said fourth transistor having a control electrode receiving a fourth constant potential.

4. A current source circuit according to claim 3, wherein said third and fourth constant potentials are of different magnitudes.

5. A current source according to claim 1, further including a logic circuit for carrying out a prescribed logical function, wherein said logic circuit includes said second and third transistors.

6. A current source circuit, comprising:

a first output terminal supplying an output current;

a first semiconductor device having a first conduction terminal, a second conduction terminal and a control terminal;

a second semiconductor device having a first conduction terminal, a second conduction terminal and a control terminal;

a third semiconductor device having a first conduction terminal, a second conduction terminal and a control terminal and being of a conductivity type opposite to that of said second semiconductor device; and a first bias voltage source for biasing said first semiconductor device in a constant current region, wherein said first conduction terminal of said first semiconductor device, said second conduction terminal of said second semiconductor device and said second conduction terminal of said third semiconductor device are connected to a common node;

said second conduction terminal of said first semiconductor device is connected to said first output terminal; and said control terminal of said first semiconductor device is connected to said first bias voltage source; and said current source circuit further comprising:

means for controlling dynamically conduction of said second and third semiconductor devices in response to an external signal.

7. A current source circuit according to claim 6, wherein said control means comprises:

a first constant voltage source and a second constant voltage source supplying a first constant potential and a second constant potential; and a supply source of said external signal; wherein said first conduction terminal of said second semiconductor device and said first conduction terminal of said third semiconductor device are connected to said first and second constant voltage sources, respectively; and said control terminals of said second and third semiconductor device are commonly connected to said supply source of said external signal.

8. A current source circuit according to claim 6, wherein said second and third semiconductor devices constitute a part of a logic circuit carrying out a prescribed logical function.

9. A current source circuit according to claim 6, further comprising:

a fourth semiconductor device having a first conduction terminal, a second conduction terminal and a control terminal and being of a conductivity type opposite to that of said first semiconductor device; and a second bias voltage source; wherein said first conduction terminal of said fourth semiconductor device is connected to said first conduction terminal of said first semiconductor device; and said control terminal of said fourth semiconductor device is connected to said second bias voltage source.

10. A current source circuit according to claim 9, wherein said second conduction terminal of said fourth semiconductor device is connected to said first output terminal.

11. A current source circuit comprising:

a first output terminal supplying a first output current;

a first bias voltage source;

a first semiconductor device having a first conduction terminal, a second conduction terminal and a control terminal;

a second semiconductor device having a first conduction terminal, a second conduction terminal and a control terminal; and a third semiconductor device having a first conduction terminal, a second conduction terminal and a control terminal and being of a conductivity type opposite to that of said second semiconductor device; wherein said first conduction terminal of said first semiconductor device, said second conduction terminal of said second semiconductor device and said second conduction terminal of said third semiconductor device are connected to a common node;

said second conduction terminal of said first semiconductor device is connected to said first output terminal; and said control terminal of said first semiconductor device is connected to said first bias voltage source;

said current source circuit further comprising:

means for controlling dynamically the conduction of said second and third semiconductor devices in response to an external signal;

a fourth semiconductor device having a first conduction terminal, a second conduction terminal and a control terminal and being of a conductivity type opposite to that of said first semiconductor device; and a second bias voltage source; wherein said first conduction terminal of said fourth semiconductor device is connected to said first conduction terminal of said first semiconductor device; and said control terminal of said fourth semiconductor device is connected to said second bias voltage source, further comprising:

a second output terminal separated from said first output terminal for supplying a second output current; wherein said second conduction terminal of said fourth semiconductor device is connected to said second output terminal.

12. In a current source circuit comprising:

a first output terminal supplying an output current;

a first semiconductor device having a first conduction terminal, a second conduction terminal and a control terminal;

a second semiconductor device having a first conduction terminal, a second conduction terminal and a control terminal; and a third semiconductor device having a first conduction terminal, a second conduction terminal and a control terminal and being of a conductivity type opposite to that of said second semiconductor device; and, a first bias voltage source for biasing said first semiconductor device in a constant current region; wherein said first conduction terminal of said first semiconductor device, said second conduction terminal of said second semiconductor device and said second conduction terminal of said third semiconductor device are connected to a common node;

said second conduction terminal of said first semiconductor device is connected to said first output terminal;

said control terminal of said first semiconductor device is connected to said first bias voltage source said second semiconductor device is rendered operative in a non-constant current region while said third semiconductor device is rendered non-conductive in response to an external signal; and said second semiconductor device non-conductive while said third semiconductor device is rendered conductive.

13. A current source circuit, comprising:

a first output terminal and a second output terminal each supplying an output current;

a first bias voltage source;

a first semiconductor device having a first conduction terminal, a second conduction terminal and a control terminal;

a second semiconductor device having a first conduction terminal, a second conduction terminal and a control terminal; and a third semiconductor device having a first conduction terminal, a second conduction terminal and a control terminal and being of a conductivity type opposite to that of said second semiconductor device; wherein said first conduction terminal of said first semiconductor device, said second conduction terminal of said second semiconductor device and said second conductive terminal of said third semiconductor device are commonly connected to a first node;

said second conduction terminal of said first semiconductor device is connected to said first output terminal;

said current source circuit further comprising:

a fourth semiconductor device having a first conduction terminal, a second conduction terminal and a control terminal and being of the same conductivity type as that of said first semiconductor device;

a fifth semiconductor device having a first conduction terminal, a second conduction terminal and a control terminal and being of the same conductivity type as that of said second semiconductor device; and a sixth semiconductor device having a first conduction terminal, a second conduction terminal and a control terminal and being of a conductivity type opposite to that of said fifth semiconductor device; wherein said first conduction terminal of said fourth semiconductor device, said second conduction terminal of said fifth semiconductor device and said second conduction terminal of said sixth semiconductor device are commonly connected to a second node;

said second conduction terminal of said fourth semiconductor device is connected to said second output terminal; and said control terminals of said first and fourth semiconductor devices are commonly connected to said first bias voltage source;

said current source circuit further comprising:

means for controlling dynamically conductions of said second, third, fifth and sixth semiconductor devices according to external signals.

14. A current source circuit according to claim 13, wherein said control means comprises:

a first constant voltage source and a second constant voltage source supplying a first constant potential and a second constant potential; and a first supply source and a second supply source of said external signals; wherein said first conduction terminal of said second semiconductor device and said first conduction terminal of said fifth semiconductor device are connected to said first constant voltage source;

said first conduction terminal of said third semiconductor device and said first conduction terminal of said sixth semiconductor device are connected to said second constant voltage source;

said control terminals of said second and third semiconductor devices are commonly connected to said first external signal supply source; and said control terminals of said fifth and sixth semiconductor devices are commonly connected to said second external signal supply source.

15. A current source circuit according to claim 13, wherein said control means comprises:

a first constant voltage source and a second constant voltage source supplying a first constant potential and a second constant potential; and a first supply source and a second supply source of said external signals; wherein said first conduction terminal of said second semiconductor device and said first conduction terminal of said fifth semiconductor device are connected to said first constant voltage source;

said first conduction terminal of said third semiconductor device and said first conduction terminal of said sixth semiconductor device are connected to said second constant voltage source;

said control terminal of said third semiconductor device is connected to said second conduction terminal of said sixth semiconductor device; and said control terminal of said sixth semiconductor device is connected to said second conduction terminal of said third semiconductor device.

16. A current source circuit according to claim 13, wherein said control means comprises:

a first constant voltage source and a second constant voltage source supplying a first constant potential and a second constant potential; and a first supply source and a second supply source of said external signals; wherein said first conduction terminal of said second semiconductor device and said first conduction terminal of said fifth semiconductor device are connected to said first constant voltage source;

said first conduction terminal of said third semiconductor device and said first conduction terminal of said sixth semiconductor device are connected to said second constant voltage source;

said control terminal of said second semiconductor device is connected to said second conduction terminal of said fifth semiconductor device; and said control terminal of said fifth semiconductor device is connected to said second conduction terminal of said second semiconductor device.

17. A current source circuit according to claim 13, wherein said second and third semiconductor devices constitute a part of a first logic circuit carrying out a prescribed logical function, and wherein said fifth and sixth semiconductor devices constitute a part of a second logic circuit carrying out a prescribed logical function.

18. A current source circuit according to claim 13, further comprising:

a seventh semiconductor device having a first conduction terminal, a second conduction terminal and a control terminal and being of a conductivity type opposite to that of said first semiconductor device;

an eighth semiconductor device having a first conduction terminal, a second conduction terminal and a control terminal and being of a conductivity type opposite to that of said fourth semiconductor device; and a second bias voltage source; wherein said first and second conduction terminals of said seventh semiconductor device are connected to said first and second conduction terminals of said first semiconductor device, respectively;

said first and second conduction terminals of said eighth semiconductor device are connected to said first and second conduction terminals of said fourth semiconductor device, respectively; and said control terminals of said seventh and eighth semiconductor devices are connected to said second bias voltage source.

19. In a current source circuit comprising:

first output terminal and a second output terminal each supplying an output current;

a first bias voltage source;

a first semiconductor device having a first conduction terminal, a second conduction terminal and a control terminal;

a second semiconductor device having a first conduction terminal, a second conduction terminal and a control terminal; and a third semiconductor device having a first conduction terminal, a second conduction terminal and a control terminal and being of a conductivity type opposite to that of said second semiconductor device; wherein said first conduction terminal of said first semiconductor device, said second conduction terminal of said second semiconductor device and said second conduction terminal of said third semiconductor device are commonly connected to a first node; and said second conduction terminal of said first semiconductor device is connected to said first output terminal;

said current source circuit further comprising:

a fourth semiconductor device having a first conduction terminal, a second conduction terminal and a control terminal and being of the same conductivity type as that of said first semiconductor device;

a fifth semiconductor device having a first conduction terminal, a second conduction terminal and a control terminal and being of the same conductivity type as that of said second semiconductor device; and a sixth semiconductor device having a first conduction terminal, a second conduction terminal and a control terminal and being of a conductivity type opposite to that of said fifth semiconductor device; wherein said first conduction terminal of said fourth semiconductor device, said second conduction terminal of said fifth semiconductor device and said second conduction terminal of said sixth semiconductor device are commonly connected to a second node;

said second conduction terminal of said fourth semiconductor device is connected to said second output terminal; and said control terminals of said first and fourth semiconductor devices are commonly connected to said first bias voltage source;

said second semiconductor device is rendered operative in a non-constant current region, said sixth semiconductor device is rendered conductive while said third and fifth semiconductor devices are rendered non-conductive in response to external signals; and said fifth semiconductor device is rendered operative in a non-constant current region, said third semiconductor device is rendered conductive while said second and sixth semiconductor devices are rendered non-conductive.

20. A current source circuit, comprising:

a first transistor of a first conductivity type connected between a connecting node and a first potential node, the control electrode of said first transistor receiving a first driving signal;

a second transistor of a second conductivity type connected between said connecting node and a second potential node, the control electrode of said second transistor receiving a second driving signal; and a third transistor of a first conductivity type connected between said connecting node and an output node, the control electrode of said third transistor receiving a signal of a bias potential so that said third transistor operates in a constant current region.

21. A current source circuit according to claim 20, wherein said first and second driving signals are the same signal.

22. A current source circuit, comprising:

a first transistor of a first conductivity type connected between a connecting node and a first potential node, the control electrode of said first transistor receiving a first driving signal;

a second transistor of a second conductivity type connected between said connecting node and a second potential node, the control electrode of said second transistor receiving a second driving signal; and a transistor group having a plurality of transistors serially connected between said connecting node and an output node, the control electrode of each transistor applied a bias potential, respectively.

23. A current source circuit according to claim 22, wherein said first and second driving signals are the same signal.

24. A current source circuit, comprising:

a first transistor of a first conductivity type connected between a first connecting node and a first potential node, the control electrode of said first transistor receiving a first driving signal;

a second transistor of a second conductivity type connected between said first connecting node and a second potential node, the control electrode of said second transistor connected to a second connecting node;

a third transistor of a first conductivity type connected between said first connecting node and a first output node, the control electrode of said third transistor receiving a bias potential;

a fourth transistor of a first conductivity type connected between said second connecting node and said first potential node, the control electrode of said fourth transistor receiving a second driving signal;

a fifth transistor of a second conductivity type connected between said second connecting node and said second potential node, the control electrode of said fifth transistor connected to said first connecting node; and a sixth transistor of a first conductivity type connected between said second connecting node and a second output node, the control electrode of said sixth transistor receiving a bias potential.

25. A current source circuit according to claim 24, wherein said bias potentials received by the control electrodes of said third and sixth transistors are the same potential.

26. A current source circuit, comprising:

a first transistor of a first conductivity type connected between a first connecting node and a first potential node, the control electrode of said first transistor connected to a second connecting node;

a second transistor of a second conductivity type connected between said first connecting node and a second potential node, the control electrode of said second transistor receiving a first driving signal;

a third transistor of a first conductivity type connected between a first connecting node and said first output node, the control electrode of said third transistor receiving a bias potential, a fourth transistor of a first conductivity type connected between said second connecting node and said first potential node, the control electrode of said fourth transistor connected to said first connecting node;

a fifth transistor of a second conductivity type connected between said second connecting node and said second potential node, the control electrode of said fifth transistor receiving a second driving signal; and a sixth transistor of a first conductivity type connected between said second connecting node and a second output node, the control electrode of said sixth transistor receiving a bias potential.

27. A current source circuit comprising:

a first transistor of a first conductivity type connected between a first connecting node and a first potential node, the control electrode of said first transistor connected to a second connecting node;

a second transistor of a second conductivity type connected between said first connecting node and a second potential node, the control electrode of said second transistor receiving a first driving signal;

a third transistor of a first conductivity type connected between a first connecting node and said first output node, the control electrode of said third transistor applied a first bias potential, a fourth transistor of a first conductivity type connected between said second connecting node and said first potential node, the control electrode of said fourth transistor connected to said first connecting node;

a fifth transistor of a second conductivity type connected between said second connecting node and said second potential node, the control electrode of said fifth transistor receiving a second driving signal; and a sixth transistor of a first conductivity type connected between said second connecting node and said second output node, the control electrode of said sixth transistor applied a second bias potential, wherein said first and second bias potentials are the same potential.

28. A current source circuit, comprising:

a first transistor of a first conductivity type connected between a connecting node and a first potential node, the control electrode of said first transistor receiving a first driving signal;

a second transistor of a second conductivity type connected between said connecting node and a second potential node, the control electrode of said second transistor receiving a second driving signal;

a third transistor of a first conductivity type connected between said connecting node and a first output node, the control electrode of said third transistor receiving a signal of a first bias potential so that said third transistor operates in a constant current region; and a fourth transistor of a second conductivity type connected between said connecting node and a second output node, the control electrode of said fourth transistor receiving a signal of a second bias potential so that said fourth transistor operates in a constant current region.

29. A current source circuit according to claim 28, wherein said first and second driving signals are the same signal.

* * * * *